United States Patent
Muto et al.

(10) Patent No.: US 9,294,699 B2
(45) Date of Patent: Mar. 22, 2016

(54) METHOD FOR DRIVING IMAGE PICKUP DEVICE, METHOD FOR CORRECTING DIGITAL SIGNAL, IMAGE PICKUP DEVICE, METHOD FOR DRIVING IMAGE CAPTURING SYSTEM, AND IMAGE CAPTURING SYSTEM

(71) Applicant: CANON KABUSHIKI KAISHA, Tokyo (JP)

(72) Inventors: Takashi Muto, Kawasaki (JP); Seiji Hashimoto, Yokohama (JP); Daisuke Yoshida, Ebina (JP); Yasushi Matsuno, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 105 days.

(21) Appl. No.: 14/132,612

(22) Filed: Dec. 18, 2013

(65) Prior Publication Data

US 2014/0175263 A1    Jun. 26, 2014

(30) Foreign Application Priority Data

Dec. 20, 2012  (JP) ................. 2012-278320
Aug. 28, 2013  (JP) ................. 2013-176254

(51) Int. Cl.
*H01L 27/00* (2006.01)
*H04N 5/369* (2011.01)
*H04N 5/355* (2011.01)
*H04N 5/378* (2011.01)
*H03M 1/10* (2006.01)

(52) U.S. Cl.
CPC ............ *H04N 5/369* (2013.01); *H03M 1/1009* (2013.01); *H04N 5/35527* (2013.01); *H04N 5/378* (2013.01)

(58) Field of Classification Search
CPC .......................... H04N 5/33527; H04N 5/378
USPC .................... 250/208.1; 341/167, 168
See application file for complete search history.

(56) References Cited

U.S. PATENT DOCUMENTS

| 7,595,824 B2 | 9/2009 | Egawa |
| 7,750,836 B2 | 7/2010 | Muramatsu |
| 2011/0242385 A1* | 10/2011 | Nishihara .............. 348/308 |
| 2012/0306674 A1 | 12/2012 | Wang |

FOREIGN PATENT DOCUMENTS

| EP | 2568700 A1 | 3/2013 |
| EP | 2645575 A2 | 10/2013 |
| JP | 2011-211535 A | 10/2011 |
| JP | 2011-244249 A | 12/2011 |
| RU | 2174253 C2 | 9/2001 |
| RU | 2430394 C2 | 9/2011 |

* cited by examiner

*Primary Examiner* — Thanh Luu
(74) *Attorney, Agent, or Firm* — Canon USA, Inc. IP Division

(57) ABSTRACT

There are provided a method for driving an image pickup device, a method for correcting a digital signal, an image pickup device, a method for driving an image capturing system, and an image capturing system. Digital signals are generated on the basis of a potential at an input node of a comparison unit by using a first reference signal whose potential changes by a first amount per unit time and a second reference signal whose potential changes by a second amount per unit time, the second amount being greater than the first amount. A correction value based on a difference in signal value between the digital signals is derived. A digital signal based on a pixel signal is corrected on the basis of the derived correction value.

19 Claims, 12 Drawing Sheets

METHOD FOR DRIVING IMAGE PICKUP DEVICE, METHOD FOR CORRECTING DIGITAL SIGNAL, IMAGE PICKUP DEVICE, METHOD FOR DRIVING IMAGE CAPTURING SYSTEM, AND IMAGE CAPTURING SYSTEM

BACKGROUND OF THE INVENTION

1. Field of the Invention

The present invention relates to an image pickup device and an image capturing system that include an analog-to-digital (AD) conversion unit configured to convert a pixel signal output by a pixel into a digital signal.

2. Description of the Related Art

Image pickup devices including an AD conversion unit configured to convert a pixel signal output by a pixel into a digital signal are available. An AD conversion unit described in Japanese Patent Laid-Open No. 2011-211535 includes a reference signal supply unit. The reference signal supply unit outputs a first reference signal whose potential changes by a first amount per unit time and a second reference signal whose potential changes by a second amount per unit time, the second amount being greater than the first amount. The AD conversion unit described in Japanese Patent Laid-Open No. 2011-211535 further includes a comparison unit. The comparison unit compares a pixel signal with the first reference signal and the second reference signal. The comparison unit also compares a potential based on a noise signal with the first reference signal and the second reference signal.

SUMMARY OF THE INVENTION

An aspect of the present invention provides a method for driving an image pickup device including a pixel configured to output a pixel signal, and an analog-to-digital conversion unit configured to convert an analog signal into a digital signal, the analog-to-digital conversion unit including a comparison unit configured to output a comparison result signal obtained by comparing an analog signal with a reference signal whose potential changes with time. The method includes generating, using the analog-to-digital conversion unit, a first digital signal on the basis of the comparison result signal output by the comparison unit as a result of the comparison unit comparing a first analog signal with a first reference signal whose potential changes by a first amount per unit time; generating, using the analog-to-digital conversion unit, a second digital signal on the basis of the comparison result signal output by the comparison unit as a result of the comparison unit comparing the first analog signal with a second reference signal whose potential changes by a second amount per unit time, the second amount being greater than the first amount; generating, using the analog-to-digital conversion unit, a third digital signal on the basis of the comparison result signal output by the comparison unit as a result of the comparison unit comparing a signal based on the pixel signal with the first reference signal or the second reference signal; and correcting the third digital signal on the basis of the first digital signal and the second digital signal.

Another aspect of the present invention provides a method for correcting a digital signal that is generated as a result of an analog-to-digital conversion unit performing analog-to-digital conversion on an analog signal. The method includes generating, using the analog-to-digital conversion unit, a first digital signal on the basis of a result obtained by comparing a first analog signal with a first reference signal whose potential changes by a first amount per unit time; generating, using the analog-to-digital conversion unit, a second digital signal on the basis of a result obtained by comparing the first analog signal with a second reference signal whose potential changes by a second amount per unit time, the second amount being greater than the first amount; and correcting the digital signal generated using the analog-to-digital conversion unit, on the basis of the first digital signal and the second digital signal.

Still another aspect of the present invention provides a method for driving an image capturing system including an image pickup device including a pixel configured to output a pixel signal, and an analog-to-digital conversion unit configured to convert an analog signal into a digital signal, the analog-to-digital conversion unit including a comparison unit configured to output a comparison result signal obtained by comparing an analog signal with a reference signal whose potential changes with time; and a signal processing unit configured to process a signal output from the image pickup device. The method includes generating, using the analog-to-digital conversion unit, a first digital signal on the basis of the comparison result signal output by the comparison unit as a result of the comparison unit comparing a first analog signal with a first reference signal whose potential changes by a first amount per unit time; generating, using the analog-to-digital conversion unit, a second digital signal on the basis of the comparison result signal output by the comparison unit as a result of the comparison unit comparing the first analog signal with a second reference signal whose potential changes by a second amount per unit time, the second amount being greater than the first amount; generating, using the analog-to-digital conversion unit, a third digital signal on the basis of the comparison result signal output by the comparison unit as a result of the comparison unit comparing a signal based on the pixel signal with the first reference signal or the second reference signal; and correcting the third digital signal on the basis of the first digital signal and the second digital signal.

A further aspect of the present invention provides an image pickup device including a pixel configured to output a pixel signal, an analog-to-digital conversion unit configured to convert an analog signal into a digital signal, a reference signal supply unit configured to supply a reference signal whose potential changes with time to the analog-to-digital conversion unit, and a correction unit. The analog-to-digital conversion unit includes a comparison unit configured to output a comparison result signal obtained by comparing an analog signal with the reference signal, and a memory unit configured to hold a first digital signal on the basis of the comparison result signal output by the comparison unit as a result of the comparison unit comparing a first analog signal with a first reference signal whose potential changes by a first amount per unit time, a second digital signal on the basis of the comparison result signal output by the comparison unit as a result of the comparison unit comparing the first analog signal with a second reference signal whose potential changes by a second amount per unit time, the second amount being greater than the first amount, and a third digital signal on the basis of the comparison result signal output by the comparison unit as a result of the comparison unit comparing a signal based on the pixel signal with the first reference signal or the second reference signal. The correction unit is configured to correct the third digital signal on the basis of the first digital signal and the second digital signal.

A still further aspect of the present invention provides an image capturing system including an image pickup device including a pixel configured to output a pixel signal, an analog-to-digital conversion unit configured to convert an analog signal into a digital signal, and a reference signal supply unit configured to supply a reference signal whose potential changes with time to the analog-to-digital conversion unit; a signal processing unit configured to process a signal output from the image pickup device; and a correction unit. The analog-to-digital conversion unit includes a comparison unit configured to output a comparison result signal obtained by comparing an analog signal with the reference signal, and a memory unit configured to hold a first digital signal on the basis of the comparison result signal output by the comparison unit as a result of the comparison unit comparing a first analog signal with a first reference signal whose potential changes by a first amount per unit time, a second digital signal on the basis of the comparison result signal output by the comparison unit as a result of the comparison unit comparing the first analog signal with a second reference signal whose potential changes by a second amount per unit time, the second amount being greater than the first amount, and a third digital signal on the basis of the comparison result signal output by the comparison unit as a result of the comparison unit comparing a signal based on the pixel signal with the first reference signal or the second reference signal. The correction unit is configured to correct the third digital signal on the basis of the first digital signal and the second digital signal.

Further features of the present invention will become apparent from the following description of exemplary embodiments with reference to the attached drawings.

DESCRIPTION OF THE EMBODIMENTS

In the image pickup device disclosed in Japanese Patent Laid-Open No. 2011-211535, an offset may be caused between signal values of digital signals obtained by converting analog signals having the same signal value using the first and second reference signals. For the image pickup device disclosed in Japanese Patent Laid-Open No. 2011-211535, reducing the offset included in the digital signal is not discussed.

A method for driving an image pickup device, a method for correcting a digital signal, an image pickup device, a method for driving an image capturing system, and an image capturing system described below each address the drawback described above.

First Embodiment

An image pickup device according to a first embodiment will be described below with reference to the drawings.

Figure 1A:
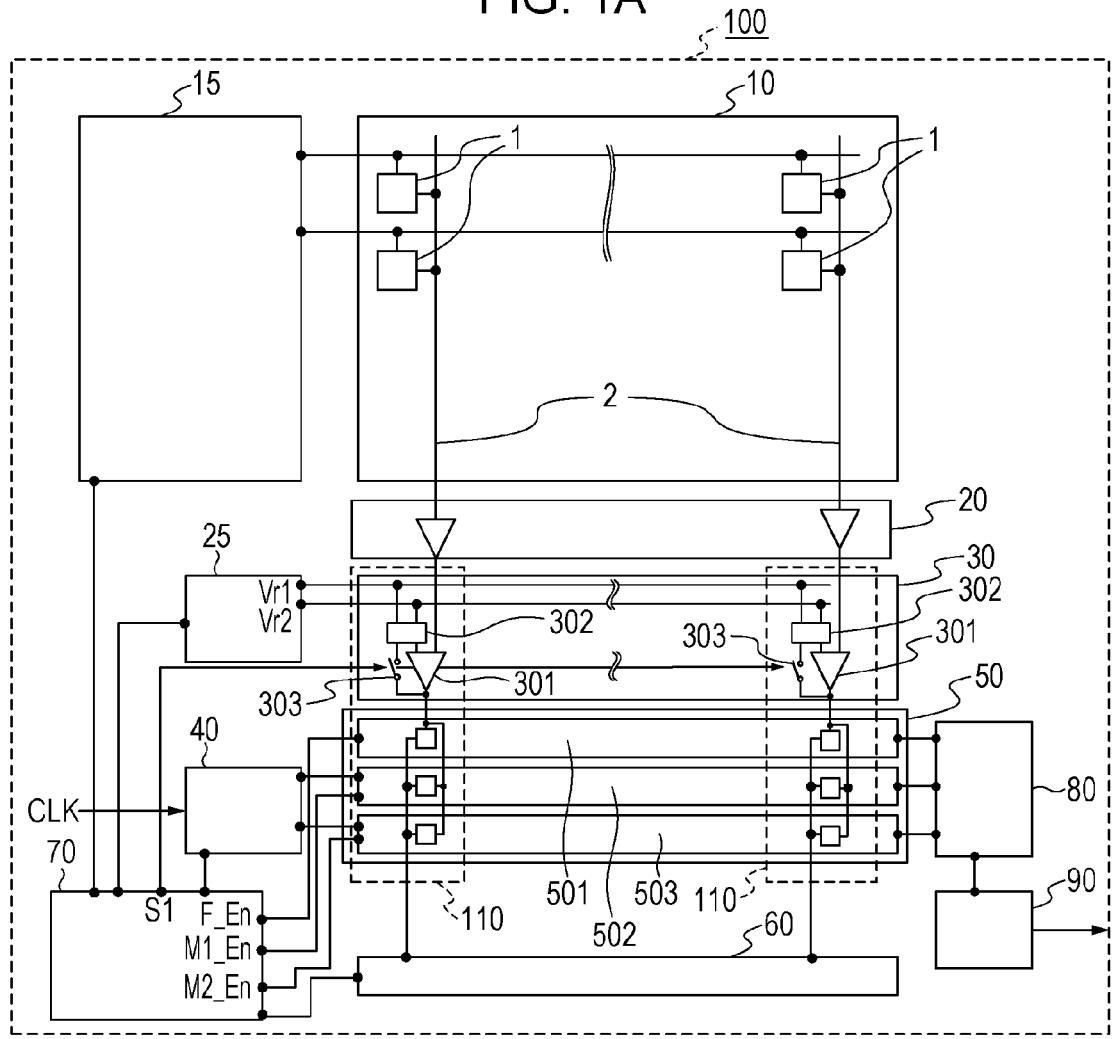
FIG. 1A is a diagram illustrating an example of the configuration of an image pickup device.

FIG. 1A is a schematic diagram of an image pickup device 100 according to the first embodiment. Components of the image pickup device 100 illustrated in FIG. 1A are formed on a single semiconductor substrate.

The image pickup device 100 includes a pixel unit 10 in which pixels 1 are arranged in multiple rows and multiple columns. The pixels 1 each output a pixel signal to an amplification unit 20 in response to scanning performed by a vertical scanning circuit 15. The pixels 1 each include a photoelectric conversion portion where photoelectric conversion of incident light occurs. A pixel signal includes a noise signal and a photoelectric conversion signal which is output on the basis of charges resulting from photoelectric conversion of incident light. The vertical scanning circuit 15 performs scanning on the pixels 1 on a row-by-row basis, in accordance with a signal output from a timing generator (hereinafter, abbreviated as TG) 70. The amplification unit 20 amplifies each pixel signal and outputs the amplified pixel signal to a corresponding comparator circuit 301 included in a comparison unit 30. The amplification unit 20 is disposed in an electrical path between the comparison unit 30 and the pixels 1. A reference signal supply unit 25 outputs multiple reference signals to selector circuits 302 in the respective columns. The comparator circuits 301 each output a selection signal SEL to the corresponding selector circuit 302 via a switch 303, on the basis of a comparison result signal which indicates a result obtained by comparing the signal output by the amplification unit 20 with a threshold signal. Based on the selection signal SEL, the selector circuits 302 each select a reference signal to be output to the corresponding comparator circuit 301 from among multiple reference signals. The comparator circuits 301 each output the comparison result signal which indicates the result obtained by comparing the signal output by the amplification unit 20 with the reference signal, to a memory unit 50 and the corresponding selector circuit 302. The memory unit 50 includes flag memories 501, first memories 502, and second memories 503. The TG 70 outputs a signal F_En to the flag memories 501. A counter 40 outputs a count signal, which represents a count of a clock signal CLK, to the first memories 502 and the second memories 503. The TG 70 outputs signals M1_En and M2_En to the first memories 502 and the second memories 503, respectively. A horizontal scanning circuit 60 causes digital signals held by the flag memories 501, the first memories 502, and the second memories 503 in the respective columns to be sequentially output to a digital signal processor (DSP) 80. The DSP 80 processes the signals output from the flag memories 501, the first memories 502, and the second memories 503 in the respective columns, and outputs the processed signals to an output circuit 90. The output circuit 90 outputs signals to outside of the image pickup device 100 in accordance with a signal output by the TG 70.

In the image pickup device 100 illustrated in FIG. 1A, each of AD conversion units 110 in a corresponding column include the comparison unit 30 and the memory unit 50. Also, each of the AD conversion units 110 is provided for a corresponding column of the pixels 1.

Figure 1B:
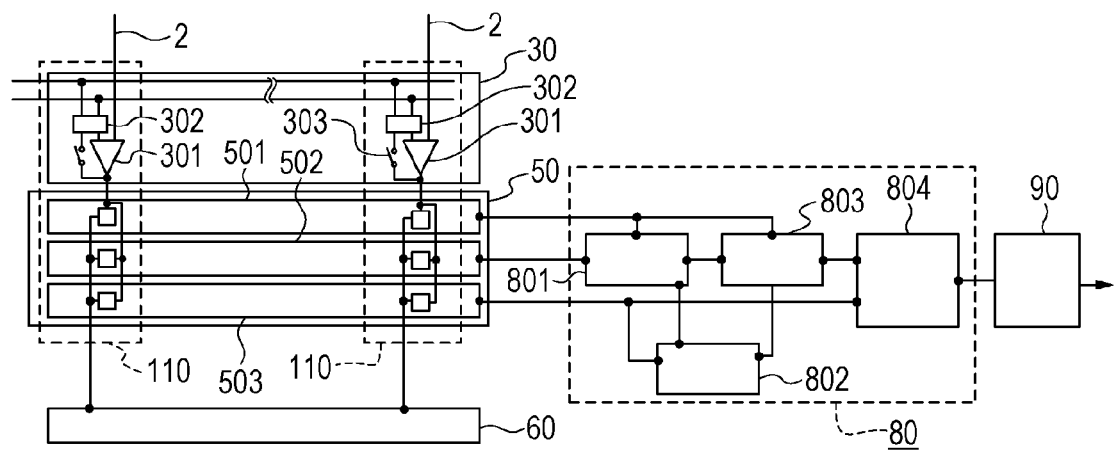
FIG. 1B is a diagram illustrating an example of the detailed configuration of a portion of the image pickup device.
Figure 4A:
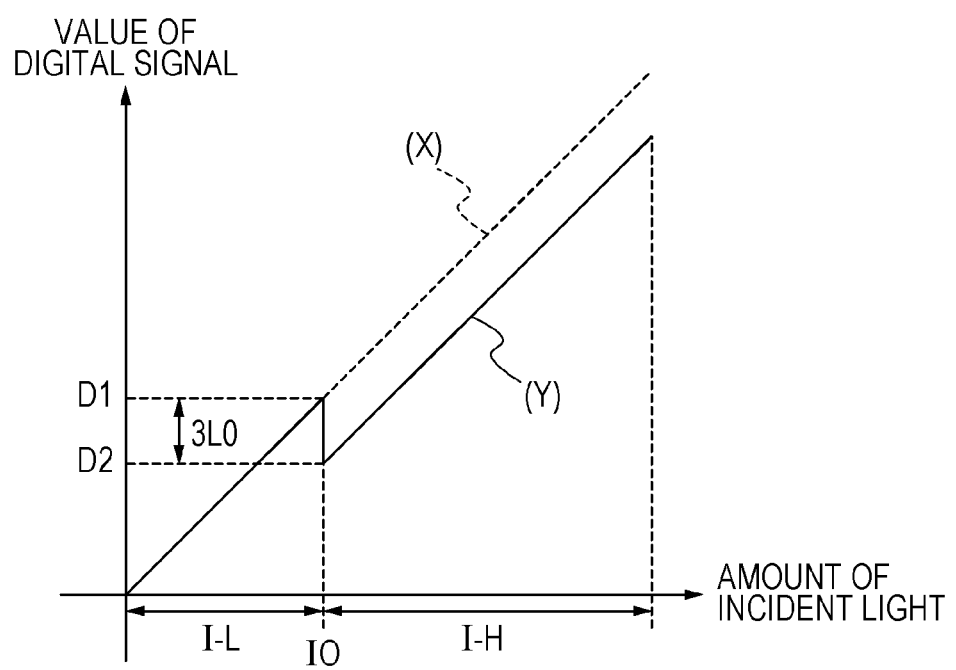
FIG. 4A is a diagram illustrating an example of an operation of the image pickup device.
Figure 4B:
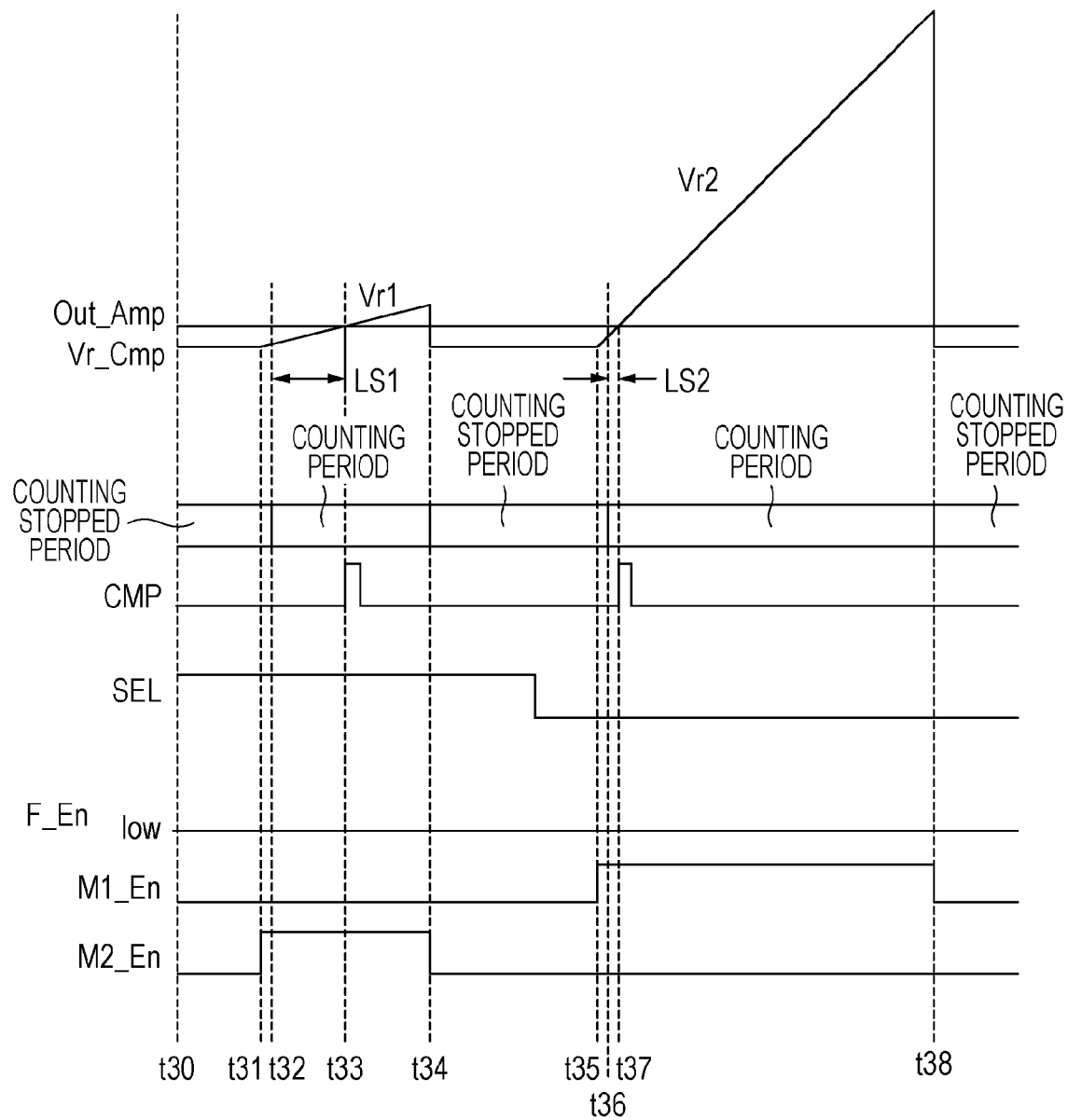
FIG. 4B is a diagram illustrating an example of an operation of the image pickup device.

Next, the configuration of the DSP 80 will be described with reference to FIG. 1B. The DSP 80 includes a level shift unit 801 configured to shift bits of a signal held in the first memory 502 to the most significant bit (MSB) side by two bits when the signal value held in the flag memory 501 is a low level. When a correction operation illustrated in FIG. 4B is performed, the level shift unit 801 outputs the resulting signal to a correction value deriving unit 802. A signal is also output to the correction value deriving unit 802 from the second memory 503. A correction value generated by the correction value deriving unit 802 is output to a correction calculation unit 803. The correction calculation unit 803 corrects the signal output by the level shift unit 801, and outputs the corrected signal to an S-N unit 804. The S-N unit 804 determines a difference between the signal output by the correction calculation unit 803 and the signal output by the second memory 503, and outputs the resulting signal to the output circuit 90. The DSP 80 serves as a correction unit in this embodiment.

Figure 2:
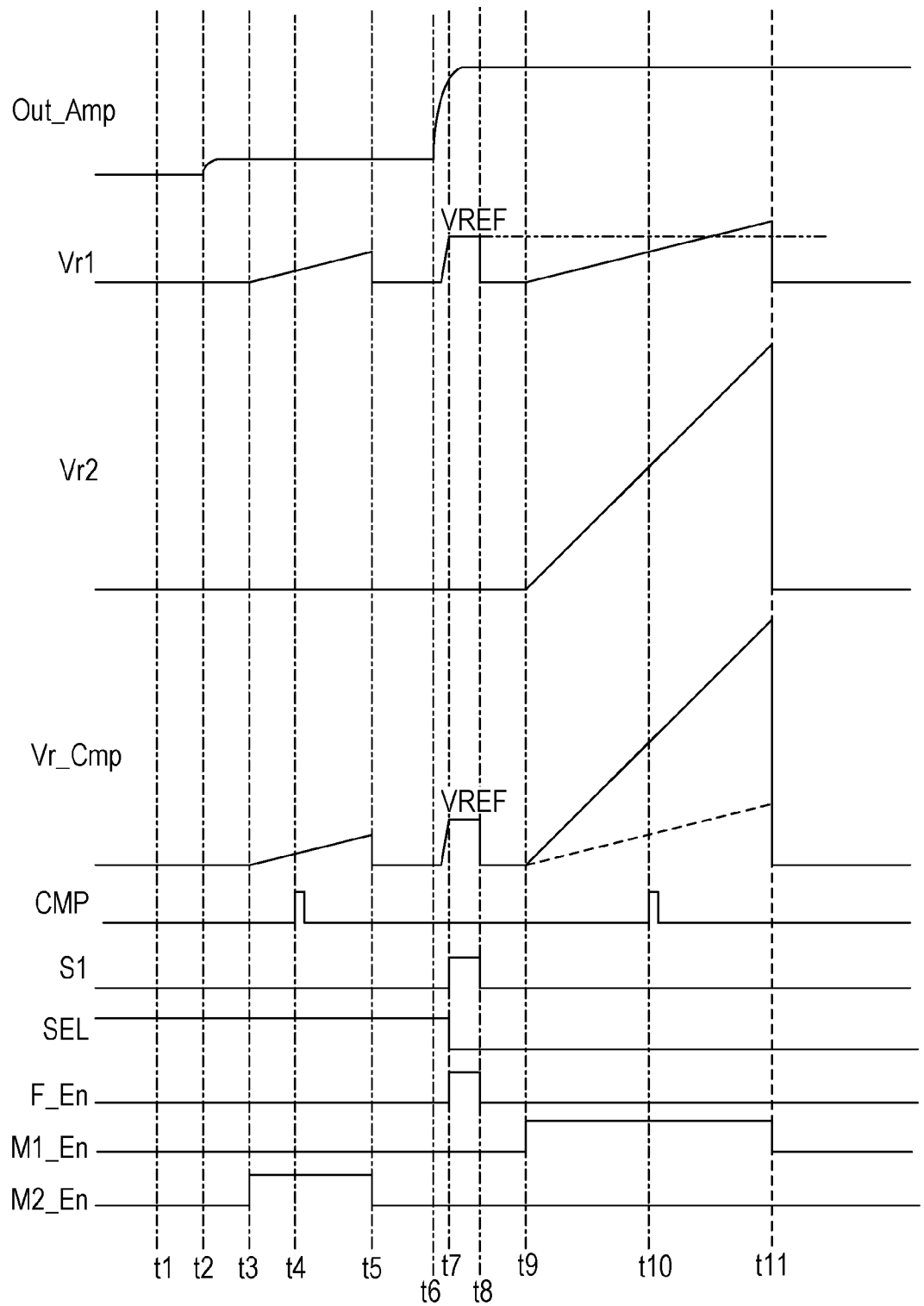
FIG. 2 is a diagram illustrating an example of an operation of the image pickup device.

Referring to FIG. 2, an operation of the image pickup device 100 illustrated in FIG. 1A will be described. In FIG. 2, Out_Amp denotes a signal output by the amplification unit 20. Vr1 and Vr2 denote reference signals output by the reference signal supply unit 25. The reference signal Vr1 serves as a first reference signal whose potential changes by a first amount per unit time. The reference signal Vr2 serves as a second reference signal whose potential changes by a second amount per unit time, the second amount being greater than the first amount. Vr_Cmp denotes a reference signal output to the comparator circuit 301 as a result of the selector circuit 302 selecting one of the reference signals Vr1 and Vr2. CMP denotes a comparison result signal which indicates the result obtained by the comparator circuit 301 by comparing the signal Out_Amp with the reference signal Vr_Cmp. S1 denotes a signal for controlling conduction of the switch 303. A high level (hereinafter, referred to as an H level) makes the switch 303 conduct. When the signal F_En is set to the H level, the flag memory 501 holds the comparison result signal CMP. The first memory 502 holds the count signal when the signal value of the comparison result signal CMP changes in a state where the signal M1_En is the H level. The second memory 503 holds the count signal when the signal value of the comparison result signal CMP changes in the state where the signal M2_En is the H level.

At time t1, the comparison result signal CMP and the signals S1, F_En, M1_En, and M2_En are a low level (hereinafter, referred to as an L level). The selection signal SEL is the H level.

At time t2, the pixel 1 outputs a noise signal. The amplification unit 20 outputs a signal obtained by amplifying the noise signal.

At time t3, the reference signal supply unit 25 starts changing the potential of the reference signal Vr1 with time. While the selection signal SEL is the H level, the selector circuit 302 outputs the reference signal Vr1, among the reference signals Vr1 and Vr2, to the comparator circuit 301. Also, the TG 70 sets the signal M2_En to the H level.

At time t4, the magnitude relation between the signal Out_Amp output by the amplification unit 20 and the reference signal Vr_Cmp reverses, and consequently the signal value of the comparison result signal CMP changes. The second memory 503 holds the count signal at this time.

At time t5, the reference signal supply unit 25 stops changing the potential of the reference signal Vr1 with time, and returns the potential of the reference signal Vr1 to the potential of the time t3. Also, the TG 70 sets the signal M2_En to the L level.

At time t6, the pixel 1 outputs a photoelectric conversion signal. The amplification unit 20 outputs a signal obtained by amplifying the photoelectric conversion signal to the comparator circuit 301.

At time t7, the reference signal supply unit 25 sets the potential of the reference signal Vr1 to a potential of a threshold signal VREF. The potential of the threshold signal VREF is nearly equal to the potential of the reference signal Vr1 at time t11 described later. If the signal Out_Amp output by the amplification unit 20 is greater than the threshold signal VREF, the comparator circuit 301 outputs the L-level comparison result signal CMP. Conversely, if the threshold signal VREF is greater than the signal Out_Amp output by the amplification unit 20, the comparator circuit 301 outputs the H-level comparison result signal CMP. Here, the description will be given on the assumption that the comparison result signal CMP output by the comparator circuit 301 is the L level. The TG 70 sets the signal S1 to the H level. Consequently, the L-level comparison result signal CMP of the time t7 is output as the selection signal SEL to the selector circuit 302. The selector circuit 302 selects a reference signal to be output to the comparator circuit 301 at and after time t9, in accordance with the signal value of the selection signal SEL of the time t7. A relation between the operation of the selector circuit 302 and the signal value of the selection signal SEL from the time t7 to the time t9 will be described. After the selection signal SEL becomes the L level at the time t7, the selector circuit 302 keeps outputting the reference signal Vr1 to the comparator circuit 301 from the time t7 to time t8. The selector circuit 302 selects the reference signal to be output at and after the time t9 in accordance with the signal value of the selection signal SEL. Also, at the time t7, the TG 70 sets the signal F_En to the H level. Consequently, the flag memory 501 holds the comparison result signal CMP of the time t7, that is, the L-level comparison result signal CMP.

At the time t8, the reference signal supply unit 25 returns the potential of the reference signal Vr1 to the potential of the time t3. Also, the TG 70 sets the signal F_En to the L level.

At the time t9, the reference signal supply unit 25 starts changing the potentials of the reference signals Vr1 and Vr2 with time. The selector circuit 302 outputs the reference signal Vr2 to the comparator circuit 301, in accordance with the L-level selection signal SEL. The TG 70 sets the signal M1_En to the H level.

At time t10, the magnitude relation between the signal Out_Amp output by the amplification unit 20 and the reference signal Vr_Cmp reverses, and consequently the signal value of the comparison result signal CMP changes. The first memory 502 holds the count signal at this time.

At the time t11, the reference signal supply unit 25 stops changing the potentials of the reference signals Vr1 and Vr2 with time, and returns the potential of the reference signal Vr1 to the potential of the time t3. The TG 70 sets the signal M1_En to the L level.

After the time t11, the horizontal scanning circuit 60 sequentially performs scanning on the memory unit 50 on a column-by-column basis so as to cause digital signals held in the flag memories 501, the first memories 502, and the second memories 503 in the respective columns to be output to the DSP 80.

Figure 3A:
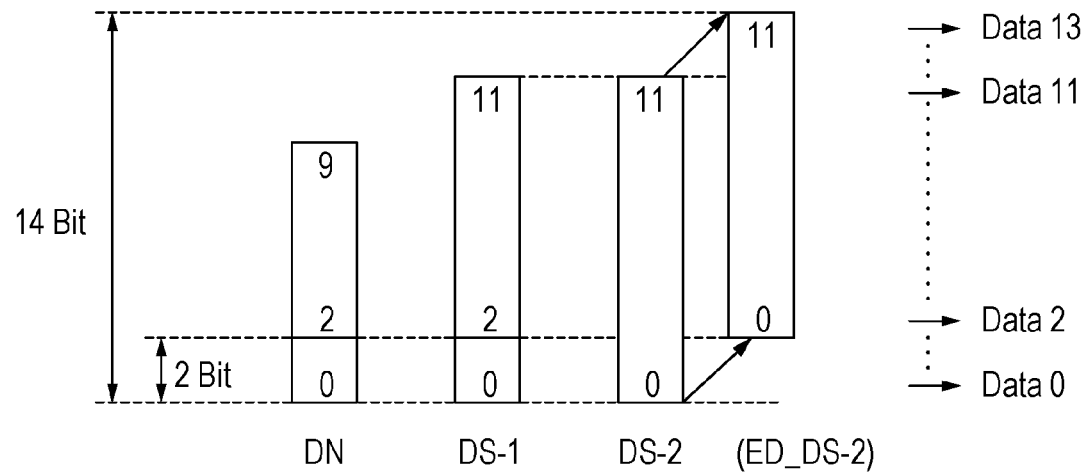
FIG. 3A is a diagram illustrating an example of a bit shift operation performed on a digital signal.

Referring next to FIG. 3A, an operation of the level shift unit 801 of the DSP 80 will be described. In FIG. 3A, DN denotes a digital signal held by the second memory 503. DS-1 denotes a digital signal held by the first memory 502 and obtained by comparing the signal Out_Amp output by the amplification unit 20 with the reference signal Vr1. DS-2 denotes a digital signal held by the first memory 502 in a column different from that of the first memory 502 which holds the aforementioned digital signal DS-1 and obtained by comparing the signal Out_Amp output by the amplification unit 20 with the reference signal Vr2. The digital signal held by the second memory 503 is 10 bits long, whereas the digital signal held by the first memory 502 is 12 bits long. FIG. 3A illustrates an example in which the amount of change in potential of the reference signal Vr2 per unit time is four times greater than that of the reference signal Vr1. Accordingly, it is necessary to make the digital signal DS-2 have a signal value that is four times greater than that of the digital signal DS-1. Because $\log_2 4=2$, bits of the digital signal DS-2 are shifted to the MSB side by two bits so as to generate a signal ED_DS-2. The S-N unit 804 subtracts the digital signal DN from the digital signal DS-1, sets signal values of Data 12 and Data 13 to zero so as to generate a 14-bit signal, and outputs the 14-bit signal to the output circuit 90. The S-N unit 804 also sets signal values of Data 0 and Data 1 of the digital signal ED_DS-2 to zero, and then subtracts the digital signal DN from the resulting signal. In this way, the digital signal output from the DSP 80 becomes a 14-bit signal constituted by Data 0 to Data 13. Note that which of the reference signals Vr1 and Vr2 has been used to obtain the digital signal held by the first memory 502 may be determined on the basis of the signal held by the flag memory 501. Specifically, as for the operation illustrated in FIG. 2, if the signal held by the flag memory 501 is the H level, the signal held by the first memory 502 is a signal obtained using the reference signal Vr1. Similarly, if the signal held by the flag memory 501 is the L level, the signal held by the first memory 502 is a signal obtained using the reference signal Vr2.

Figure 3B:
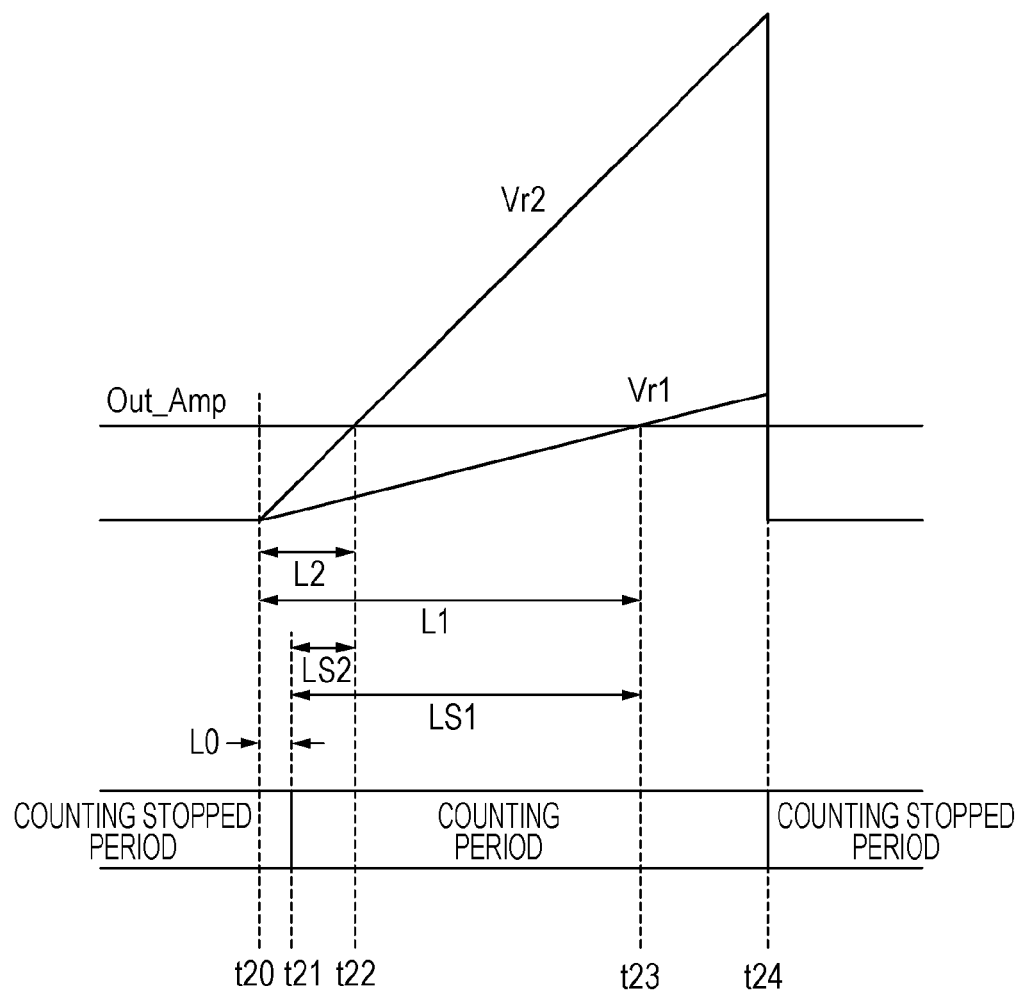
FIG. 3B is a diagram illustrating an example of operations of a reference signal supply unit and a counter.

Referring to FIG. 3B, operations of the reference signal supply unit 25 and the counter 40 will be further described. FIG. 3B is a schematic diagram illustrating cases where the signal Out_Amp having a certain signal value is compared with the reference signals Vr1 and Vr2. At time t20, the reference signal supply unit 25 starts changing the potentials of the reference signals Vr1 and Vr2 with time. It is assumed that the counter 40 starts counting the clock signal at time t21, which is behind the start of changing the potentials of the reference signals Vr1 and Vr2.

When the signal Out_Amp is compared with the reference signal Vr2, the comparison result signal CMP changes at time t22. When the signal Out_Amp is compared with the reference signal Vr1, the comparison result signal CMP changes at time t23. At time t24, the reference signal supply unit 25 stops changing the potentials of the reference signals Vr1 and Vr2 with time and the counter 40 stops counting the clock signal.

Now, the digital signal held by the first memory 502 will be described. The case of using the reference signal Vr1 will be described first. A period L1 from when the potential of the reference signal Vr1 is started to change with time to when the signal value of the comparison result signal CMP changes is expressed as $$L1 = t23 - t20 \quad (1).$$

A period LS1 from when the counter 40 starts counting the clock signal to when the signal value of the comparison result signal CMP changes is expressed as $$LS1 = t23 - t21 \quad (2).$$

Further, a period L0 from when the potential of the reference signal Vr1 is started to change with time to when the counter 40 starts counting is expressed as $$L0 = t21 - t20 \quad (3).$$

The period LS1 is expressed using the periods L1 and L0 as follows:

$$LS1 = L1 - L0 \quad (4).$$

A count signal corresponding to the period LS1 is a digital signal generated using the reference signal Vr1.

Similarly, the case of using the reference signal Vr2 will be described. A period L2 from when the potential of the reference signal Vr2 is started to change with time to when the signal value of the comparison result signal CMP changes is expressed as $$L2 = t22 - t20 \quad (5).$$

A period LS2 from when the counter 40 starts counting the clock signal to when the signal value of the comparison result signal CMP changes is expressed as $$LS2 = t22 - t21 \quad (6).$$

The period LS2 is expressed using the periods L2 and L0 as follows:

$$LS2 = L2 - L0 \quad (7).$$

A count signal corresponding to the period LS2 is a digital signal generated using the reference signal Vr2.

It is assumed herein that the amount of change in potential of the reference signal Vr2 per unit time is four times greater than that of the reference signal Vr1. In this case, a relationship of $$L1 = 4 \times L2 \quad (8)$$

holds between the periods L1 and L2.

As illustrated in FIG. 3A, bits of the digital signal generated using the reference signal Vr2 are shifted to the MSB side by two bits. The resulting digital signal has a signal value equivalent to the count signal which is obtained over a period four times longer than the period LS2. The period 4LS2 is expressed using the periods LS1 and L0 as follows:

$$4LS2 = 4L2 - 4L0 = L1 - 4L0 = LS1 - 3L0 \quad (9).$$

In FIG. 3B, a signal having a certain signal value output by the amplification unit 20 is converted into digital signals using the reference signals Vr1 and Vr2. Thus, a signal resulting from shifting of the digital signal obtained using the reference signal Vr2 to the MSB side by two bits ideally has a signal value equal to that of the digital signal obtained using the reference signal Vr1. However, as indicated by Equation (9), when a timing at which the reference signals Vr1 and Vr2 are started to change with time differs from a timing at which the counter 40 starts counting the clock signal, an offset of 3L0 is caused.

This offset will be described using FIG. 4A. FIG. 4A illustrates a digital signal output by the DSP 80 in the case where correction according to the first embodiment (described later) is not performed. Referring to FIG. 4A, the horizontal axis denotes the amount of light that is incident to a photoelectric conversion portion of the pixel 1, whereas the vertical axis denotes a value of the digital signal output by the DSP 80. Also, (X) denotes a digital signal obtained when AD conversion is performed using the reference signal Vr1, whereas (Y) denotes a digital signal obtained when AD conversion is performed using the reference signal Vr2. I-L denotes a range for which the signal Out_Amp output by the amplification unit 20 is compared with the reference signal Vr1. I-H denotes a range for which the signal Out_Amp output by the amplification unit 20 is compared with the reference signal Vr2. I0 denotes a boundary between the ranges I-L and I-H. A graph of a solid line denotes a relationship between the amount of incident light and a digital signal generated through AD conversion using the reference signal Vr1 in the range I-L and the reference signal Vr2 in the range I-H. A graph of a dashed line denotes a relationship between the amount of incident light and a digital signal generated through AD conversion using the reference signal Vr1 in the range I-H. An offset of 3L0 is caused at an amount of light at the boundary I0 between the ranges I-L and I-H. In the first embodiment, a correction operation is performed to reduce a difference between the signal values of the digital signals (X) and (Y) for the certain amount of incident light.

FIG. 4B is a diagram illustrating the correction operation according to the first embodiment. Over a period of the correction operation illustrated in FIG. 4B, the pixel 1 is outputting a noise signal.

At time t30, the selection signal SEL is the H level and signals M1_En and M2_En are the L level.

At time t31, the reference signal supply unit 25 starts changing the potential of the reference signal Vr1 with time. Also, the TG 70 sets the signal M2_En to the H level. At time t32, which is behind the time t30 by the period L0, the counter 40 starts counting the clock signal.

At time t33, the signal value of the comparison result signal CMP changes. The second memory 503 holds the count signal at this time. This count signal held by the second memory 503 is referred to as a digital signal DN1. The digital signal DN1 serves as a first digital signal generated by the AD conversion unit 110 on the basis of the comparison result signal CMP that is output by the comparison unit 30 as a result of comparing a first analog signal with a first reference signal.

At time t34, the reference signal supply unit 25 stops changing the potential of the reference signal Vr1 with time.

During a period from the time t34 to time t35, the selection signal SEL changes from the H level to the L level.

At the time t35, the reference signal supply unit 25 starts changing the potential of the reference signal Vr2 with time. Also, the TG 70 sets the signal M1_En to the H level. At time t36, which is behind the time t35 by the period L0, the counter 40 starts counting the clock signal.

At time t37, the signal value of the comparison result signal CMP changes. The first memory 502 holds the count signal at this time. This count signal held by the first memory 502 is referred to as a digital signal DN2. The digital signal DN2 serves as a second digital signal generated by the AD conversion unit 110 on the basis of the comparison result signal CMP that is output by the comparison unit 30 as a result of comparing the first analog signal with a second reference signal.

At time t38, the reference signal supply unit 25 stops changing the potential of the reference signal Vr2 with time.

Next, an operation of the correction value deriving unit 802 will be described.

The level shift unit 801 shifts bits of the digital signal DN2 held by the first memory 502 to the MSB side by two bits. The resulting digital signal DN2 obtained through bit shifting to the MSB side by two bits is then output to the correction value deriving unit 802. The correction value deriving unit 802 derives a correction value α using Equation (10) below.

$$\alpha = DN1 - 4 \times DN2 \quad (10),$$

where DN1 denotes the signal value of the digital signal DN1 and 4×DN2 denotes the signal value of the digital signal obtained by shifting bits of the digital signal DN2 to the MSB side by two bits.

The correction value deriving unit 802 outputs the derived correction value α to the correction calculation unit 803. Bits of the digital signal held by the first memory 502 in a column where the flag memory 501 holds the L level are shifted to the MSB side by two bits by the level shift unit 801. The resulting signal is output to the correction calculation unit 803. The correction calculation unit 803 adds the correction value α to the signal obtained through bit shifting performed by the level shift unit 801. Note that the digital signal held by the first memory 502 serves as a third digital signal based on a pixel signal.

On the other hand, the bit shift operation and the addition operation of the correction value α are not performed by the level shift unit 801 and the correction calculation unit 803, respectively, on the digital signal held by the first memory 502 in a column where the flag memory 501 holds the H level.

The image pickup device 100 according to the first embodiment includes the correction value deriving unit 802 and the correction calculation unit 803. With this configuration, an offset included in the digital signal arising from a difference between the timing at which the potential of the reference signal is started to change with time and the timing at which the counter starts counting the clock signal may be reduced.

In the first embodiment, the configuration has been described where the counter 40 starts counting after the potential of the reference signal has been started to change with time. The correction operation according to the first embodiment is also applicable to another configuration where the counter 40 starts counting before the potential of the reference signal is started to change with time. An offset of +3L0 is caused from the calculation of (X)−(Y) for the digital signals (X) and (Y) described in FIG. 4A. In the configuration where the counter 40 starts counting before the potential of the reference signal is started to change with time, an offset of −3L0 is caused from (X)−(Y). However, also in this configuration, by performing the correction operation described with reference to FIG. 4B, a digital signal may be obtained in which an offset caused as a result of the counter 40 starting counting before the potential of the reference signal is started to change with time is reduced.

Note that the correction value α of the first embodiment may be derived for each AD conversion unit 110 in a corresponding column. Alternatively, the correction values α may be derived using digital signals output by the AD conversion units 110 in multiple columns and an averaged correction value may be used by the correction calculation unit 803. Alternatively, the AD conversion units 110 in the respective columns may be grouped into multiple blocks and an average of the correction values α may be derived for each block. For example, in the case where a buffer for relaying the count signal are provided for every multiple AD conversion units 110 in multiple columns, the AD conversion units 110 may be grouped into blocks on a buffer-by-buffer basis. This is because the buffer possibly causes a delay of the count signal, specifically, because the difference between the timing at which the potential of the reference signal is started to change with time and the timing at which the count signal is input to each column of the memory unit 50 may vary at the buffer. When the correction value α is derived, the first digital signals and the second digital signals obtained by the AD conversion units 110 on the multiple columns are each averaged, and the correction value α used in common for the AD conversion units 110 on the multiple columns may be derived from a difference between the averaged first and second digital signals. Alternatively, the multiple correction values α may be obtained for multiple frames. In this case, the correction calculation unit 803 may use the average of the multiple correction values α. By averaging the multiple correction values α, random noise contained the correction values α may be reduced. Thus, the correction calculation unit 803 may generate a digital signal in which the influence of random noise is reduced from the input digital signal.

Also, the correction operation according to the first embodiment may be performed immediately after power-on of the image pickup device 100. Alternatively, the correction operation according to the first embodiment may be performed during a blanking interval from when the vertical scanning circuit 15 finished scanning all rows of the pixel unit 10 to when the vertical scanning circuit 15 starts scanning the pixel unit 10 next time. Alternatively, the correction operation according to the first embodiment may be performed when the image capturing mode, such as the movie mode or still image mode, is changed.

FIG. 4B illustrates the configuration where the pixel 1 outputs a noise signal in the first embodiment. Instead of the noise signal, a signal output by the amplification unit 20 on the basis of a reset potential at an input node of the amplification unit 20 may be used. In the case where the amplification unit 20 is a capacitance-feedback amplification circuit, the potential may be reset by making a feedback path from an output node of a differential amplifier to an input node of the differential amplifier conduct. The input node of this differential amplifier serves as the input node of the amplification unit 20. In addition to the configuration where the potential at the input node of the amplification unit 20 is reset, a configuration is also possible in which the signal input to the comparator circuit 301 is kept substantially constant from the time t31 to the time t34 and from the time t35 to the time t38. If the signal input to the comparator circuit 301 during the correction operation illustrated in FIG. 4B is a signal based on the reset potential at the input node of the amplification unit 20, the correction operation for deriving the correction value α may be performed during an exposure accumulation period over which the pixels 1 are exposed to light when a still image is captured. In the case where the correction operation is performed during the exposure accumulation period, the correction operation for determining the correction value α may be suitably performed during a period over which the vertical scanning circuit 15 does not perform vertical scan on the pixels 1 of the pixel unit 10 or a period over which the noise signal is being output from the pixel unit 10.

Also, in the description of the first embodiment, a ratio of the amount of change in the potential of the reference signal Vr2 per unit time to that of the reference signal Vr1 is four, but the first embodiment may be suitably carried out for another ratio. For example, suppose that the ratio of the amount of change in the potential of the reference signal Vr2 per unit time to that of the reference signal Vr1 is eight. In this case, the level shift unit 801 shifts bits of the digital signal held by the first memory 502 in a column where the flag memory 501 holds the L level to the MSB side by three bits, and outputs the resulting signal to the correction calculation unit 803. The correction value deriving unit 802 may derive the correction value α using Equation (11) below.

$$\alpha = DN1 - 8 \times DN2 \quad (11)$$

Let G denote the ratio of the amount of change in the potential of the reference signal Vr2 per unit time to that of the reference signal Vr1. Then, the correction value α may be derived using Equation (12) below.

$$\alpha = DN1 - G \times DN2 \quad (12)$$

In the first embodiment, the configuration of correcting the digital signal generated using the reference signal Vr2 has been described. Alternatively, the digital signal generated using the reference signal Vr1 may be corrected. Specifically, the correction value α obtained using Equation (10) may be subtracted from the digital signal held by the first memory 502 in a column where the flag memory 501 holds the H level. Even in this configuration, the image pickup device that uses multiple reference signals whose potentials change by different amounts per unit time may reduce an offset arising from a difference between the timing at which the potential of the reference signal is started to change with time and the timing at which the counter starts counting the clock signal. Also, in the first embodiment, the configuration of deriving the correction value α on the basis of the difference between the first digital signal and the second digital signal has been described, but another configuration is also possible. For example, the correction value α may be derived on the basis of a ratio between the first digital signal and the second digital signal.

The image pickup device disclosed in Japanese Patent Laid-Open No. 2011-211535 compares a potential based on a photoelectric conversion signal and a potential based on a noise signal with a first reference signal and a second reference signal. In contrast, in the first embodiment, the potential based on the photoelectric conversion signal may be compared with one of the first reference signal and the second reference signal. Also, the potential based on the noise signal may be compared with the first reference signal. In the image pickup device 100 according to the first embodiment, the DSP 80 performs the bit shift operation and the operation for complementing less significant bits of the signal value after the bit shifting. Accordingly, the resolution of the digital signal based on the photoelectric conversion signal and the resolution of the digital signal based on the noise signal are matched without comparing the potentials based on the photoelectric conversion signal and the noise signal with the first and second reference signals. This allows the image pickup device 100 according to the first embodiment to reduce a period required for AD conversion of pixel signals output from pixels of one row, compared with the image pickup device disclosed in Japanese Patent Laid-Open No. 2011-211535.

Second Embodiment

An image pickup device according to a second embodiment will be described below with reference to the drawings mainly on differences from the first embodiment.

The image pickup device 100 according to the second embodiment may not only provide benefits provided by the image pickup device 100 according to the first embodiment but also reduce errors in a digital signal which arise from variations in the ratio between the amounts of change in the potential of multiple reference signals per unit time.

Figure 5A:
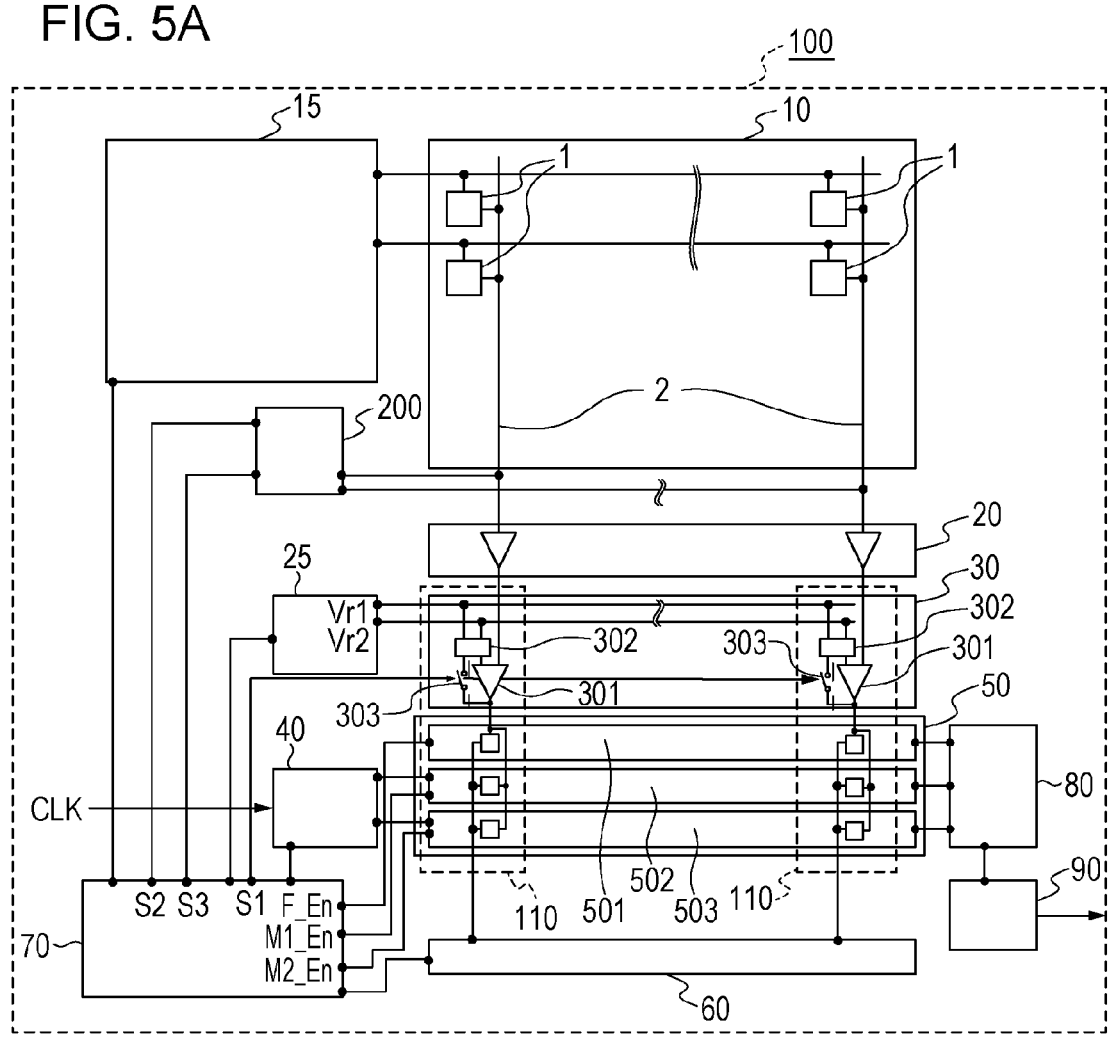
FIG. 5A is a diagram illustrating an example of the configuration of an image pickup device.

FIG. 5A illustrates the image pickup device 100 according to the second embodiment. In FIG. 5A, components having functions similar to those of the corresponding components of the image pickup device 100 illustrated in FIG. 1A are denoted by the same references as those used in FIG. 1A. The image pickup device 100 according to the second embodiment includes a test signal supply unit 200 that is electrically connected to vertical signal lines 2. Signals S2 and S3 are output to the test signal supply unit 200 from the TG 70.

Figure 5B:
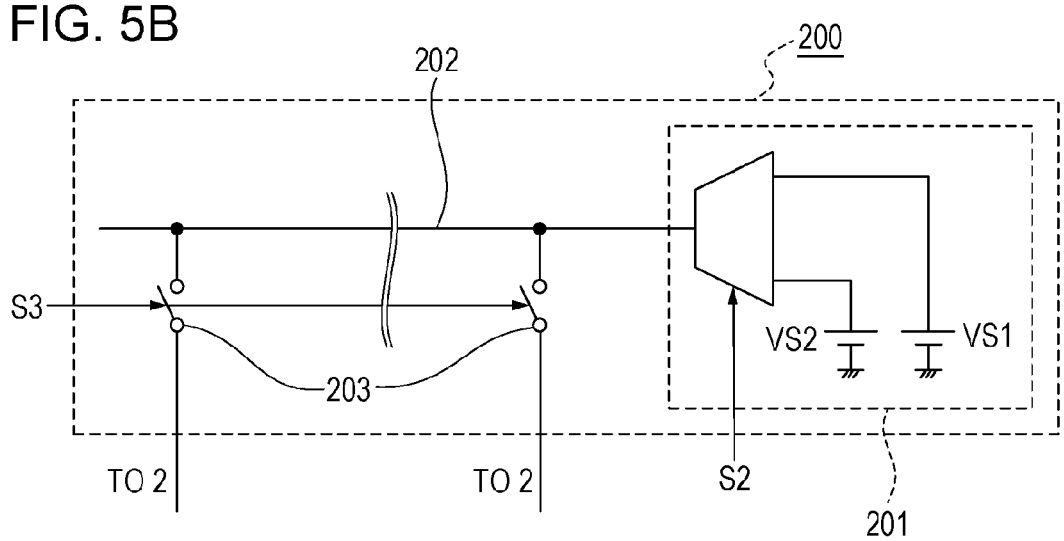
FIG. 5B is a diagram illustrating an example of the detailed configuration of a portion of the image pickup device.

FIG. 5B is a diagram illustrating an example of the configuration of the test signal supply unit 200. The test signal supply unit 200 includes a test signal selection unit 201, a test signal supply line 202, and switches 203. The test signal selection unit 201 outputs one of test signals VS1 and VS2, which have different signal values, to the test signal supply line 202 on the basis of the signal S2. The test signal VS1 used in the second embodiment has a signal value of the noise signal of the pixel 1 in the first embodiment. The test signal VS2 used in the second embodiment has a signal value that is lower than or equal to the potential of the reference signal Vr1 at time t48 (described later). The test signal supply line 202 is electrically connected to the vertical signal lines 2 in the respective columns via the respective switches 203. The switches 203 conduct while the signal S3 is the H level.

Figure 6A:
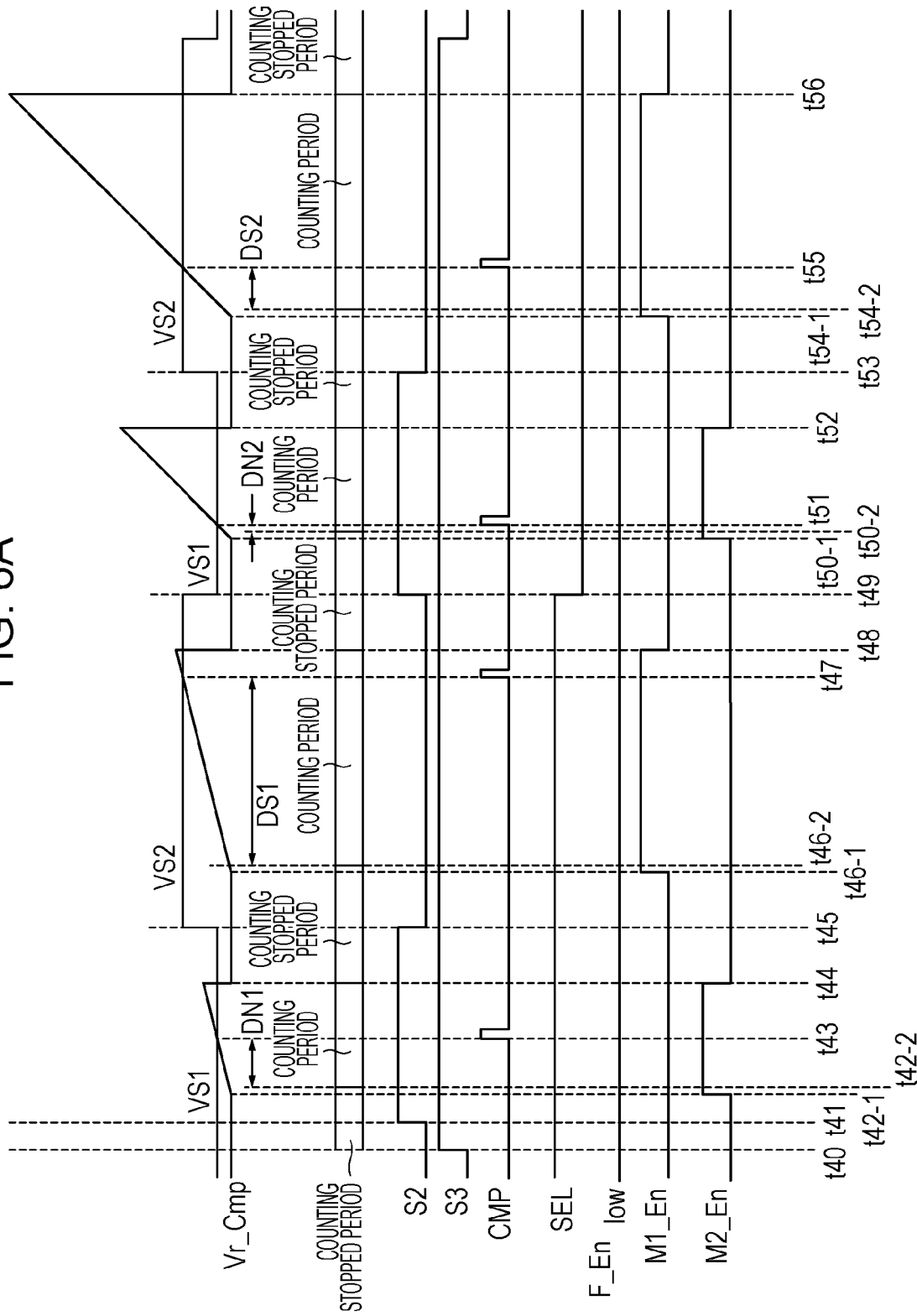
FIG. 6A is a diagram illustrating an example of an operation of the image pickup device.

Referring to FIG. 6A, a correction operation of the image pickup device 100 according to the second embodiment will be described.

At time t40, the signal S3 is the H level, and thus a signal on the test signal supply line 202 is output to the vertical signal lines 2 in the respective columns. The selection signal SEL is the H level.

At time t41, the TG 70 sets the signal S2 to the H level. Consequently, the test signal VS1 is output to the vertical signal lines 2 in the respective columns.

At time t42-1, the reference signal supply unit 25 starts changing the potential of the reference signal Vr1 with time. The TG 70 sets the signal M2_En to the H level. Then, at time t42-2, the counter 40 starts counting the clock signal.

At time t43, the magnitude relation between the test signal VS1 and the reference signal Vr1 reverses, and consequently the signal value of the comparison result signal CMP changes. The second memory 503 holds the count signal at this time. This count signal held by the second memory 503 is referred to as a digital signal DN1 in the second embodiment. The digital signal DN1 serves as a first digital signal generated by the AD conversion unit 110 on the basis of the comparison result signal CMP that is output by the comparison unit 30 as a result of comparing a first analog signal with a first reference signal.

At time t44, the reference signal supply unit 25 stops changing the potential of the reference signal Vr1.

At time t45, the TG 70 sets the signal S2 to the L level. Consequently, the test signal VS2 is output to the vertical signal lines 2 in the respective columns via the test signal supply line 202 and the respective switches 203.

At time t46-1, the reference signal supply unit 25 starts changing the potential of the reference signal Vr1 with time. Also, the TG 70 sets the signal M1_En to the H level. Then, at time t46-2, the counter 40 starts counting the clock signal.

At time t47, the magnitude relation between the test signal VS2 and the reference signal Vr1 reverses, and consequently the signal value of the comparison result signal CMP changes. The first memory 502 holds the count signal at this time. This count signal held by the first memory 502 is referred to as a digital signal DS1 in the second embodiment. The digital signal DS1 serves as a fourth digital signal generated by the AD conversion unit 110 on the basis of the comparison result signal CMP that is output by the comparison unit 30 as a result of comparing the first reference signal with a second analog signal having a signal value different from that of the first analog signal.

At the time t48, the reference signal supply unit 25 stops changing the potential of the reference signal Vr1 with time. During a period from the time t48 to time t50-1, the horizontal scanning circuit 60 sequentially transfers, to the DSP 80, signals held by the first memories 502 and the second memories 503 in the respective columns.

At time t49, the TG 70 sets the signal S2 to the H level. Consequently, the test signal VS1 is output to the vertical signal lines 2 in the respective columns via the test signal supply line 202 and the respective switches 203. Also, the TG 70 sets the selection signal SEL to the L level.

At time t50-1, the reference signal supply unit 25 starts changing the potential of the reference signal Vr2 with time. Also, the TG 70 sets the signal M2_En to the H level. Then, at time t50-2, the counter 40 starts counting the clock signal.

At time t51, the magnitude relation between the test signal VS1 and the reference signal Vr2 reverses, and consequently the signal value of the comparison result signal CMP changes. The second memory 503 holds the count signal at this time. This count signal held by the second memory 503 is referred to as a digital signal DN2 in the second embodiment. The digital signal DN2 serves as a second digital signal generated by the AD conversion unit 110 on the basis of the comparison result signal CMP that is output by the comparison unit 30 as a result of comparing the first analog signal with a second reference signal.

At time t52, the reference signal supply unit 25 stops changing the potential of the reference signal Vr2 with time.

At time t53, the TG 70 sets the signal S2 into the L level.

At time t54-1, the reference signal supply unit 25 starts changing the potential of the reference signal Vr2 with time. Also, the TG 70 sets the signal M1_En to the H level. Then, at time t54-2, the counter 40 starts counting the clock signal.

At time t55, the magnitude relation between the test signal VS2 and the reference signal Vr2 reverses, and consequently the signal value of the comparison result signal CMP changes. The first memory 502 holds the count signal at this time. This count signal held by the first memory 502 is referred to as a digital signal DS2 in the second embodiment. The digital signal DS2 serves as a fifth digital signal generated by the AD conversion unit 110 on the basis of the comparison result signal CMP that is output by the comparison unit 30 as a result of comparing the second analog signal with the second reference signal.

At time t56, the reference signal supply unit 25 stops changing the potential of the reference signal Vr2 with time.

After the time t56, the horizontal scanning circuit 60 sequentially transfers, to the DSP 80, signals held by the first memories 502 and the second memories 503 in the respective columns.

Figure 6B:
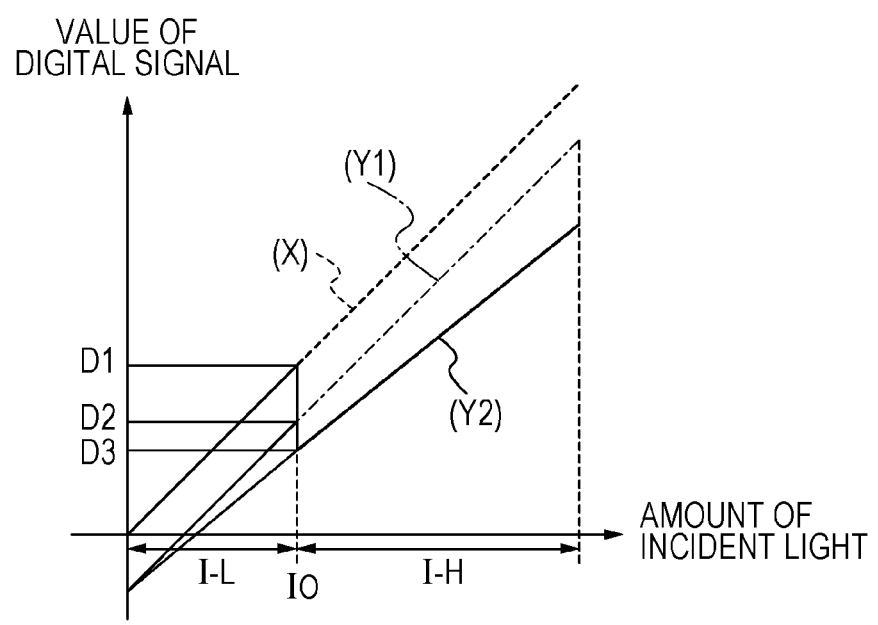
FIG. 6B is a diagram illustrating an example of an operation of the image pickup device.

Referring to FIG. 6B, signal values of digital signals obtained when the correction operation according to the second embodiment is not performed will be described. In FIG. 6B, (Y1) and (Y2) denote digital signals resulting from AD conversion using the reference signal Vr2. Specifically, (Y1) denotes a digital signal obtained when the ratio of the amount of change in the potential of the reference signal Vr2 per unit time to that of the reference signal Vr1 is four. In contrast, (Y2) denotes a digital signal obtained when the ratio of the amount of change in the potential of the reference signal Vr2 per unit time to that of the reference signal Vr1 is less than four owing to errors. At the boundary 10 between the ranges I-L and I-H, signal values of the digital signals (X) and (Y1) are D1 and D2, respectively, as described in FIG. 4A. Further, in the case of (Y2), the ratio of the amount of change in the potential of the reference signal Vr2 per unit time to that of the reference signal Vr1 is less than four owing to errors, and thus the signal value of the resulting digital signal is D3, which is smaller than D2. In the second embodiment, a correction operation is performed to reduce a difference between the signal values of the digital signals (X) and (Y2) at a certain amount of incident light.

Next, the correction operation according to the second embodiment will be described. The DSP 80 that performs this correction operation may have a configuration similar to that of the first embodiment.

The correction value deriving unit 802 derives correction values α and β using Equations (13) and (14) below.

$$\alpha = DS1 - 4 \times \beta \times DS2 \quad (13)$$

$$\beta = \frac{DS1 - DN1}{G \times (DS2 - DN2)} \quad (14)$$

The correction value deriving unit 802 outputs the derived correction values α and β to the correction calculation unit 803. Bits of a digital signal held by the first memory 502 at a column where the flag memory 501 holds the L level are shifted to the MSB side by two bits by the level shift unit 801, and the resulting signal is then output to the correction calculation unit 803. The correction calculation unit 803 corrects the signal resulting from bit shifting by the level shift unit 801 on the basis of Equation (15) below.

$$CAL\_DS = \alpha + ED\_DS \times \beta \quad (15)$$

In Equation (15), ED_DS denotes a signal obtained by shifting a digital signal held by the first memory 502 on a column where the flag memory 501 holds the L level to the MSB side by two bits and output to the correction calculation unit 803 by the level shift unit 801, and CAL_DS denotes a corrected digital signal output by the correction calculation unit 803.

The bit shift operation and the addition operation of the correction value α are not performed by the level shift unit 801 and the correction calculation unit 803, respectively, on a digital signal held by the first memory 502 in a column where the flag memory 501 holds the H level.

Operations of the S-N unit 804 and the output circuit 90 may be the same as those of the first embodiment. Also, the correction value α may be obtained using Equation (16) below instead of Equation (13).

$$\alpha = DN1 - 4 \times \beta \times DN2 \quad (16)$$

Equation (13) uses the digital signal generated using the test signal VS2, whereas Equation (16) uses the digital signal generated using the test signal VS1 having a signal value smaller than that of the test signal VS2. For this reason, Equation (16) is more likely to be affected by noise and the accuracy of the correction value α possibly becomes low. Thus, it is preferable to use Equation (13).

With the image pickup device 100 according to the second embodiment, benefits similar to those of the first embodiment may be obtained. Further, the image pickup device 100 according to the second embodiment may reduce errors of the digital signal which arise from variations in the ratio between amounts of changes in the potential of multiple reference signals per unit time.

During the operation illustrated in FIG. 6A in the second embodiment, the digital signals are generated in an order of DN1, DS1, DN2, and DS2. Alternatively, the digital signals may be generated in an order of DN1, DN2, DS1, and DS2, for example. In this case, the digital signals DN1 and DN2 are respectively held by the first memory 502 and the second memory 503. The horizontal scanning circuit 60 sequentially transfers, to the DSP 80, the digital signals from the respective columns of the memory unit 50. Thereafter, the digital signals DS1 and DS2 are respectively held by the first memory 502 and the second memory 503. Then, the horizontal scanning circuit 60 sequentially transfers, to the DSP 80, the digitals signals from the respective columns of the memory unit 50. In an alternative example, the image pickup device 100 may include two first memories and two second memories for each column. The two first memories each store a corresponding one of the digital signals DN1 and DN2. The two second memories each store a corresponding one of the digital signals DS1 and DS2. In this case, four memories are needed. In contrast, the image pickup device 100 according to the second embodiment includes one first memory 502 and one second memory 503 in the AD conversion unit 110 on each column. This may make the circuit size of the memory unit 50 smaller than the case where the AD conversion unit 110 on each column includes two first memories 502 and two second memories 503.

The above-described case where the digital signals are obtained in the order of DN1, DN2, DS1, and DS2 will be described again. In this case, the test signal VS1 having a more constant signal value than the case of FIG. 6A may be converted into a digital signal. Thus, the variation in the noise component included in the digital signals DN1 and DN2 may be reduced. The same applies to the case of using the signals output by the pixels 1 instead of the test signals output by the test signal supply unit 200. Specifically, AD conversion is performed on a noise-signal-based signal output from the pixel 1 using the reference signals Vr1 and Vr2. Then, AD conversion is performed on a photoelectric-conversion-signal-based signal output from the pixel 1 using the reference signals Vr1 and Vr2. Even in this case, the correction values α and β of Equations (13) and (14) may be derived. Variations are less likely to occur in the signal values of the noise signal and photoelectric conversion signal that are AD converted using the reference signals Vr1 and Vr2, compared with the configuration in which AD conversion is performed in the order of FIG. 6A. In this way, the digital signals from which variations in the signal values of the noise signal and photoelectric conversion signal are reduced may be obtained. As a result, the more accurate correction values α and β may be obtained. This benefit is not limitedly obtained from the configuration in which the digital signals are obtained in the order of DN1, DN2, DS1, and DS2. Two digital signals based on the test signal VS1 may be sequentially generated. Also, two digital signals based on the test signal VS2 may be sequentially generated. For example, the digital signals may be generated in an order of DN2, DN1, DS2, and DS1 or of DS1, DS2, DN2, and DN1. That is, after one of the first digital signal and the second digital signal is generated, the other of the first digital signal and the second digital signal may be generated. Also, after one of the fourth digital signal and the fifth digital signal is generated, the other of the fourth digital signal and the fifth digital signal may be generated.

The case has been described where the image pickup device 100 according to the second embodiment corrects the digital signal generated using the reference signal Vr2. Alternatively, as described in the first embodiment, the digital signal generated using the reference signal Vr1 may be corrected. Specifically, the signal value of the digital signal held by the first memory 502 in a column where the flag memory 501 holds the H level is divided by the correction value β. Then, the correction value α is subtracted from the result. In this way, benefits similar to those described in the first embodiment may be obtained. Also, the image pickup device 100 according to the second embodiment may reduce errors in the digital signal which arise from variations in the ratio between the amounts of change in the potential of multiple reference signals per unit time.

Herein, the case has been described where the counter 40 supplies a count signal in common to the AD conversion units 110 on the respective columns. Alternatively, the AD conversion units 110 on the respective columns may each include a counter. In an example of this case, the AD conversion units 110 on the respective columns each include a counter, a flag memory, a first memory, and a second memory. Even in this case, operations of the counter, the flag memory, the first memory, and the second memory may be the same as those described in each embodiment.

Also, herein, the case has been described where the potential of the reference signal changes with time in a slope-like manner, but the reference signal may change in a step-like manner. The reference signal whose potential changes in a step-like manner is an example of the reference signal whose potential changes with time.

Third Embodiment

In a third embodiment, an image pickup device obtains the correction values α and β using output signals output by the reference signal supply unit 25 instead of the test signals output by the test signal supply unit 200.

Differences from the second embodiment will be mainly described below with reference to the drawings.

The image pickup device 100 according to the third embodiment has a configuration similar to that illustrated in FIG. 1.

Figure 8A:
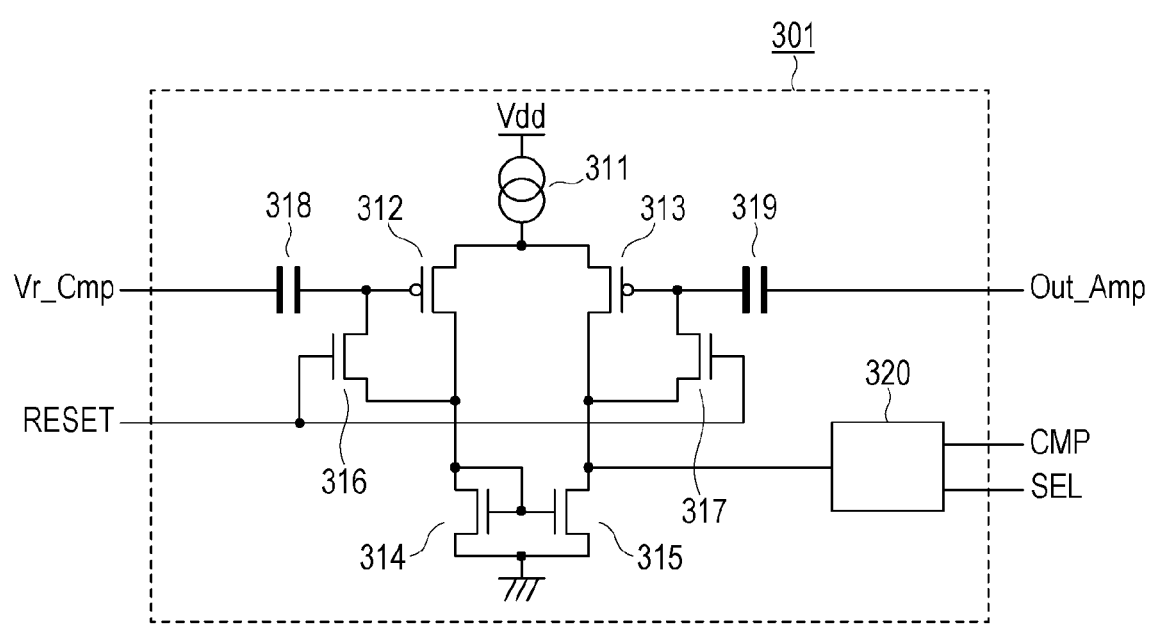
FIG. 8A is a diagram illustrating an example of the configuration of a portion of an image pickup device.

FIG. 8A illustrates the configuration of the comparator circuit 301 according to the third embodiment.

A supply voltage Vdd is supplied to one end of a current source 311. The other end of the current source 311 is electrically connected to a main node of a PMOS transistor 312 and a main node of a PMOS transistor 313. The other main node of the PMOS transistor 312 is electrically connected to a main node of an NMOS transistor 314. The other main node of the PMOS transistor 313 is electrically connected to a main node of an NMOS transistor 315. A ground voltage is supplied to the other main nodes of the NMOS transistors 314 and 315. Control nodes of the NMOS transistors 314 and 315 are electrically connected in common to the main node of the NMOS transistor 314. Control nodes of the PMOS transistors 312 and 313 are electrically connected to nodes of capacitance elements 318 and 319, respectively. The reference signal Vr_Cmp is input to the other node of the capacitance element 318. The output signal Out_Amp is input to the other node of the capacitance element 319.

The control nodes of the PMOS transistors 312 and 313 are electrically connected to main nodes of NMOS transistors 316 and 317, respectively. Also, a node to which the main nodes of the PMOS transistor 312 and the NMOS transistor 314 are electrically connected is electrically connected to the other main node of the NMOS transistor 316. Also, a node to which the main nodes of the PMOS transistor 313 and the NMOS transistor 315 are electrically connected is electrically connected to the other main node of the NMOS transistor 317. A signal RESET is input to the control nodes of the NMOS transistors 316 and 317 from the TG 70. When the TG 70 sets the signal RESET to the H level, the node to which the main nodes of the PMOS transistor 312 and the NMOS transistor 314 are electrically connected and the control node of the PMOS transistor 312 are short-circuited. Also, the node to which the main nodes of the PMOS transistor 313 and the NMOS transistor 317 are electrically connected and the control node of the PMOS transistor 313 are short-circuited. Consequently, the control nodes of the PMOS transistors 312 and 313 have substantially equal potentials.

The comparator circuit 301 includes a comparison output circuit 320.

The node to which the main nodes of the PMOS transistor 313 and the NMOS transistor 315 are electrically connected is further electrically connected to the comparison output circuit 320. Based on a result obtained by comparing the output signal Out_Amp with the reference signal Vr_Cmp, the comparison output circuit 320 outputs the comparison result signal CMP and the selection signal SEL to the selector circuit 302. Although not illustrated in FIG. 8A, the signal value of the selection signal SEL output by the comparison output circuit 320 may be forcibly set under control of the TG 70 independently from the result obtained by comparing the output signal Out_Amp with the reference signal Vr_Cmp.

Subsequently, an operation of the image pickup device 100 according to the third embodiment will be described.

Figure 8B:
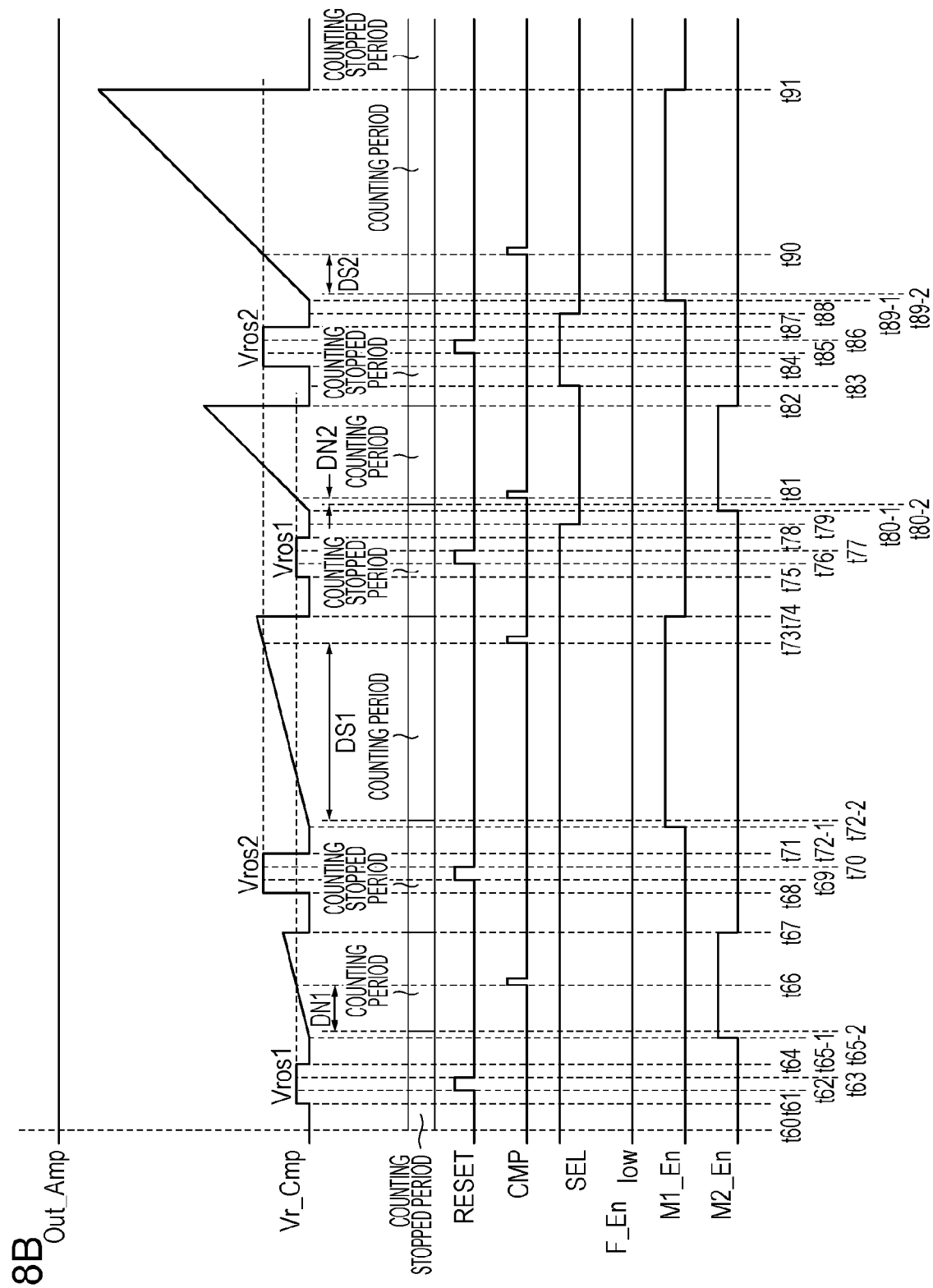
FIG. 8B is a diagram illustrating an example of an operation of the image pickup device.

FIG. 8B is a timing chart illustrating an operation according to the third embodiment. Over a period illustrated in FIG. 8B, the pixel 1 is outputting a noise signal. Over the period illustrated in FIG. 8B, the output signal Out_Amp has a signal level of the amplified noise signal. Also, over the period illustrated in FIG. 8B, the comparison output circuit 320 outputs the selection signal SEL having a signal value based on control of the TG 70 to the selector circuit 302.

At time t60, the TG 70 keeps the selection signal SEL at the H level, and thus the selector circuit 302 outputs the reference signal Vr1 to the comparator circuit 301. Also, the TG 70 keeps the signal RESET at the L level.

At time t61, the reference signal supply unit 25 changes the potential of the reference signal Vr1 to Vros1.

At time t62, the TG 70 sets the signal RESET to the H level. Then, at time t63, the TG 70 sets the signal RESET to the L level. Consequently, the control nodes of the PMOS transistors 312 and 313 have substantially equal potentials. Because the signal value of the output signal Out_Amp is constant, the signal value of the comparison result signal CMP changes from the L level to the H level when the amplitude of the potential of the reference signal Vr1 becomes greater than that of the potential Vros1.

At time t64, the reference signal supply unit 25 returns the potential of the reference signal Vr1 to the potential of the time t60.

At time t65-1, the reference signal supply unit 25 starts changing the potential of the reference signal Vr1 with time. The TG 70 sets the signal M2_En to the H level. Then, at time t65-2, the counter 40 starts counting the clock signal.

At time t66, the amplitude of the reference signal Vr_Cmp becomes greater than that of the potential Vros1. At this time, the signal value of the comparison result signal CMP changes from the L level to the H level. In response to changing of the signal value of the comparison result signal CMP from the L level to the H level at the time t66, the second memory 503 holds the digital signal DN1.

At time t67, the reference signal supply unit 25 stops changing the potential of the reference signal Vr1.

At time t68, the reference signal supply unit 25 changes the potential of the reference signal Vr1 to the potential Vros2, which is greater than the potential Vros1 in amplitude. At time t69, the TG 70 sets the signal RESET to the H level. Then, at time t70, the TG 70 sets the signal RESET to the L level. Because the signal value of the output signal Out_Amp is constant, the signal value of the comparison result signal CMP changes from the L level to the H level when the amplitude of the potential of the reference signal Vr1 becomes greater than that of the potential Vros2.

At time t71, the reference signal supply unit 25 returns the potential of the reference signal Vr1 to the potential of the time t60.

At time t72-1, the reference signal supply unit 25 starts changing the potential of the reference signal Vr1 with time. Also, the TG 70 sets the signal M1_En to the H level. Then, at time t72-2, the counter 40 starts counting the clock signal.

At time t73, the reference signal Vr_Cmp exceeds the potential Vros2. At this time, the comparator circuit 301 determines that the magnitude relation has reversed, and consequently the signal value of the comparison result signal CMP changes. In response to changing of the signal value of the comparison result signal CMP from the L level to the H level at the time t73, the first memory 502 holds the digital signal DS1.

At time t74, the reference signal supply unit 25 stops changing the potential of the reference signal Vr1 with time.

Over a period from the time t74 to time t75, the horizontal scanning circuit 60 sequentially transfers, to the DSP 80, the signals held by the first memories 502 and the second memories 503 in the respective columns.

At the time t75, the reference signal supply unit 25 sets the potential of the reference signal Vr1 to Vros1.

At time t76, the TG 70 sets the signal RESET to the H level. Then, at the time t76, the TG 70 sets the signal RESET to the L level. Because the signal value of the output signal Out_Amp is constant, the signal value of the comparison result signal CMP changes from the L level to the H level when the amplitude of the potential of the reference signal Vr2 which is input later becomes greater than that of the potential Vros1.

At time t78, the reference signal supply unit 25 returns the potential of the reference signal Vr1 to the potential of the time t60.

At time t79, the TG 70 sets the selection signal SEL to the L level. The selector circuit 302 outputs the reference signal Vr2 to the comparator circuit 301.

At time t80-1, the reference signal supply unit 25 starts changing the potential of the reference signal Vr2 with time. The TG 70 sets the signal M2_En to the H level. Then, at time t80-2, the counter 40 starts counting the clock signal.

At time t81, the amplitude of the potential of the reference signal Vr2 becomes greater than that of the potential Vros1. At this time, the signal value of the comparison result signal CMP changes from the L level to the H level. In response to changing of the signal value of the comparison result signal CMP from the L level to the H level at the time t81, the second memory 503 holds the digital signal DN2.

At time t82, the reference signal supply unit 25 stops changing the potential of the reference signal Vr2.

At time t83, the TG 70 sets the selection signal SEL to the H level. The selector circuit 302 outputs the reference signal Vr1 to the comparator circuit 301.

At time t84, the reference signal supply unit 25 changes the potential of the reference signal Vr1 to Vros2.

At time t85, the TG 70 sets the signal RESET to the H level. Then, at time t86, the TG 70 sets the signal RESET to the L level. Because the signal value of the output signal Out_Amp is constant, the signal value of the comparison result signal CMP changes from the L level to the H level when the amplitude of the potential of the reference signal Vr2 which is input later becomes greater than that of the potential Vros2.

At time t87, the reference signal supply unit 25 returns the potential of the reference signal Vr1 to the potential of the time t60.

At time t88, the TG 70 sets the selection signal SEL to the L level. The selector circuit 302 outputs the reference signal Vr2 to the comparator circuit 301.

At time t89-1, the reference signal supply unit 25 starts changing the potential of the reference signal Vr2 with time. Also, the TG 70 sets the signal M1_En to the H level. Then, at time t89-2, the counter 40 starts counting the clock signal.

At time t90, the amplitude of the potential of the reference signal Vr_Cmp becomes greater than that of the potential Vros2. At this time, the signal value of the comparison result signal CMP changes from the L level to the H level. In response to changing of the signal value of the comparison result signal CMP from the L level to the H level at the time t90, the first memory 502 holds the digital signal DS2.

At time t91, the reference signal supply unit 25 stops changing the potential of the reference signal Vr2 with time.

After the time t91, the horizontal scanning circuit 60 sequentially transfers, to the DSP 80, the signals held by the first memories 502 and the second memories 503 at the respective columns.

The DSP 80 and the output circuit 90 may perform operations similar to those of the second embodiment using the digital signals DN1, DN2, DS1, and DS2 obtained through the above operation.

As described above, the image pickup device 100 according to the third embodiment may derive the correction values α and β using the output signals output by the reference signal supply unit 25 instead of the test signals output by the test signal supply unit 200.

Fourth Embodiment

Figure 7:
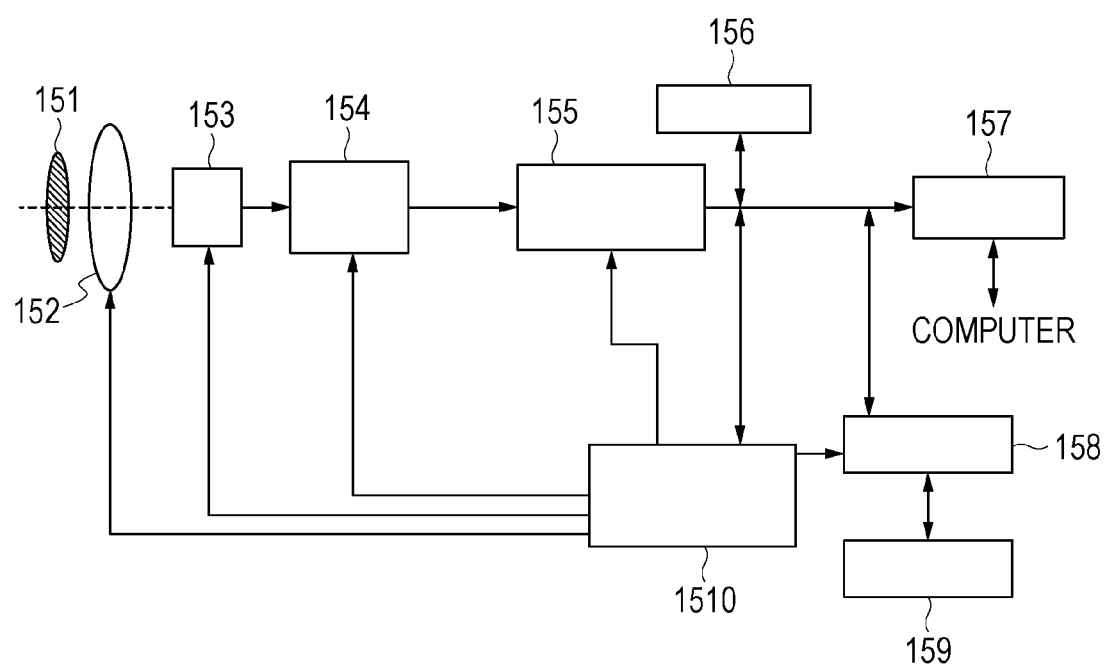
FIG. 7 is a diagram illustrating an example of an image capturing system.

FIG. 7 illustrates an image capturing system that uses the image pickup device 100 described in the first to third embodiments as an image pickup device 154.

Referring to FIG. 7, the image capturing system includes a barrier 151 that protects a lens, a lens 152 that forms an optical image of a subject on the image pickup device 154, and an aperture 153 that makes the amount of light that has passed through the lens 152 variable. The image capturing system further includes an output signal processing unit 155 configured to process a signal output from the image pickup device 154. The signal output from the image pickup device 154 is a captured image signal used to generate a captured image of the subject. The output signal processing unit 155 performs various types of correction and compression on the captured image signal output from the image pickup device 154 if necessary so as to generate an image. The lens 152 and the aperture 153 constitute an optical system that collects rays onto the image pickup device 154.

The image capturing system illustrated in FIG. 7 further includes a buffer memory unit 156 that temporarily stores image data, and an external interface unit 157 that communicates with an external computer or the like. The image capturing system further includes a removable recording medium 159, such as a semiconductor memory, on which and from which captured image data is recorded and read, and a recording medium control interface unit 158 that records and reads captured image data on and from the recording medium 159. The image capturing system further includes a central control and processing unit 1510 configured to perform various kinds of processing and control in the image capturing system.

In the image capturing system illustrated in FIG. 7, the DSP 80 described in the first to third embodiments may be included in the output signal processing unit 155 which is provided outside the image pickup device 154. In this configuration, the output signal processing unit 155 serves as a signal processing unit including a correction unit. Even with this configuration, the image capturing system according to the fourth embodiment may obtain benefits similar to those described in the first to third embodiments. Alternatively, the DSP 80 described in the first to third embodiments may be included in the central control and processing unit 1510 which is provided outside the image pickup device 154. In this configuration, the central control and processing unit 1510 serves as the signal processing unit including the correction unit.

Fifth Embodiment

Figure 9A:
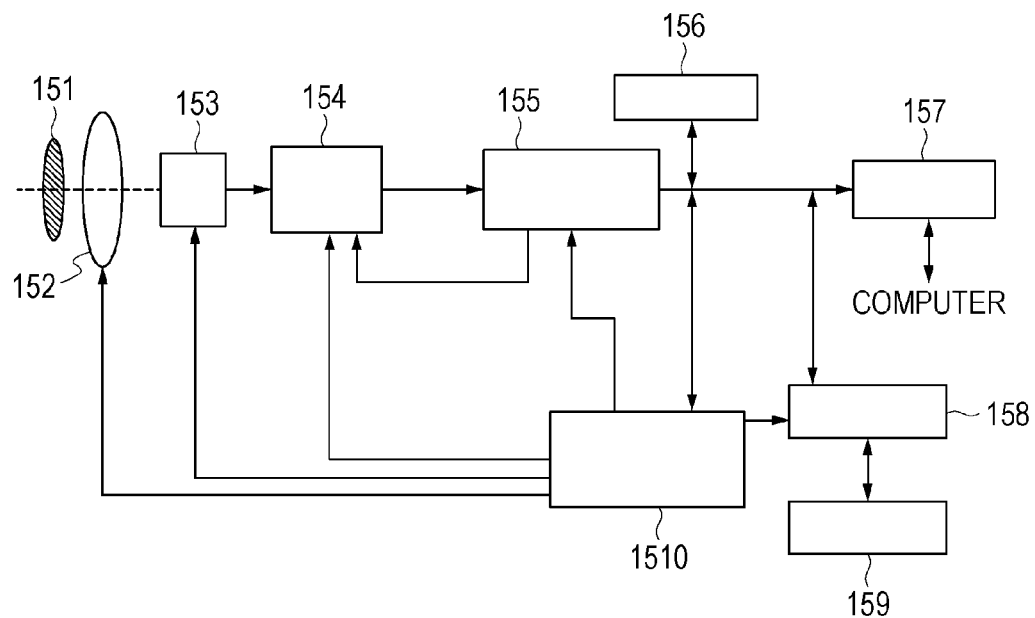
FIG. 9A is a diagram illustrating an example of an image capturing system.

FIG. 9A illustrates an image capturing system according to a fifth embodiment. In FIG. 9A, components having functions similar to those of the components illustrated in FIG. 7 are denoted by the same references as those used in FIG. 7. Differences from the fourth embodiment will be mainly described below.

The image pickup device 154 of the image capturing system according to the fifth embodiment differs from the image pickup device 100 described in the second embodiment in that the image pickup device 154 does not include the correction value deriving unit 802.

Figure 9B:
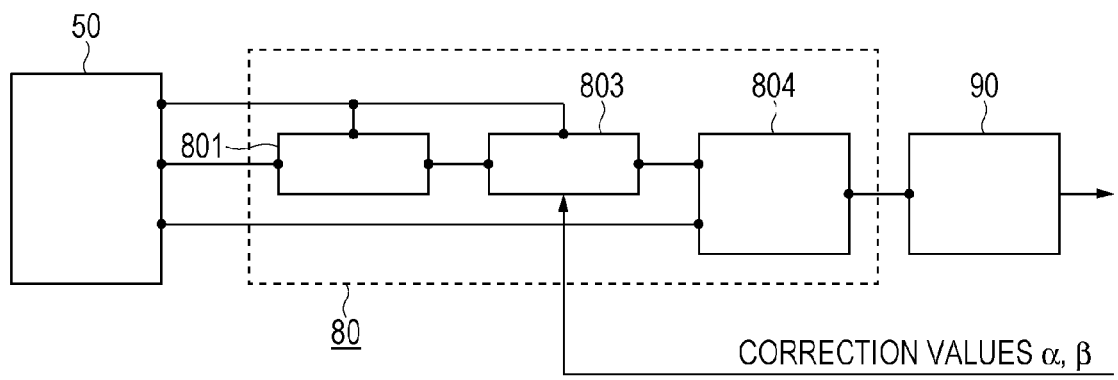
FIG. 9B is a diagram illustrating an example of the configuration of a digital signal processor (DSP) of an image pickup device.

FIG. 9B illustrates the configuration of the DSP 80 included in the image pickup device 154 in the fifth embodiment. In FIG. 9B, components having functions similar to those of the components illustrated in FIG. 1 are denoted by the same references as those used in FIG. 1. The DSP 80 includes the level shift unit 801, the correction calculation unit 803, and the S-N unit 804. Note that the correction value deriving unit 802 described in the second embodiment is included in the output signal processing unit 155 in the image capturing system according to the fifth embodiment. The components of the image pickup device 154 are disposed on a single semiconductor substrate, but the correction value deriving unit 802 is disposed on a semiconductor substrate different from the semiconductor substrate having the image pickup device 154 thereon.

When the AD conversion unit 110 performs AD conversion on the test signals, the DSP 80 outputs the resulting digital signals DN1, DN2, DS1, and DS2 to the output signal processing unit 155 via the output circuit 90. The correction value deriving unit 802 included in the output signal processing unit 155 derives the correction values α and β on the basis of the digital signals DN1, DN2, DS1, and DS2. The correction value deriving unit 802 outputs the derived the correction values α and β to the correction calculation unit 803.

The correction calculation unit 803 holds the correction values α and β output from the output signal processing unit 155. When the AD conversion unit 110 performs AD conversion on a signal based on a pixel signal, the correction calculation unit 803 performs a correction operation similar to that of the second embodiment using the correction values α and β. That is, the correction calculation unit 803 serves as a correction unit configured to correct a digital signal based on a pixel signal, on the basis of the correction values output from the correction value deriving unit 802.

As described above, even when a circuit that derives the correction values α and β from the digital signals DN1, DN2, DS1, and DS2 is disposed on a semiconductor substrate different from that of the image pickup device, benefits similar to those of the second embodiment may be obtained.

Note that the image pickup device 154 included in the image capturing system according to the fifth embodiment is similar to the image pickup device 100 according to the second embodiment except for the configuration of the DSP 80. In another example, the image pickup device 154 included in the image capturing system according to the fifth embodiment may be similar to the image pickup device 100 according to the third embodiment except for the configuration of the DSP 80. The image capturing system of this example may also obtain benefits similar to those of the third embodiment.

Also, in the fifth embodiment, the example has been described in which the image pickup device 154 generates the digital signals DN1, DN2, DS1, and DS2. In another example in which the image pickup device 154 does not generate the digital signals DS1 and DS2 but generates the digital signals DN1 and DN2, benefits similar to those of the first embodiment may be obtained.

The image pickup devices and image capturing systems according to the above-described embodiments may reduce an offset caused between multiple digital signals generated using respective reference signals having different amounts of change in the potential per unit time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-278320 filed Dec. 20, 2012 and No. 2013-176254 filed Aug. 28, 2013, which are hereby incorporated by reference herein in their entirety.

What is claimed is:

1. A method for driving an image pickup device, the image pickup device comprising:
   a pixel configured to output a pixel signal, and
   an analog-to-digital conversion unit configured to convert an analog signal into a digital signal, the analog-to-digital conversion unit comprising:
      a comparison unit configured to output a comparison result signal obtained by comparing an analog signal with a reference signal whose potential changes with time, and
      a counting unit configured to generate a count value by counting a clock signal,
   the method comprising:
   generating, a first digital signal having the count value generated by the counting unit as a result of counting the clock signal during a period from when the counting unit starts counting the clock signal in response to a timing at which a potential of a first reference signal (Vr1) starts changing at the counting unit by a first amount per unit time, to when a signal value of the comparison result signal obtained by comparing a first test signal being the analog signal with the first reference signal changes;
   generating, a second digital signal having the count value generated by the counting unit as a result of counting the clock signal during a period from when the counting unit starts counting the clock signal in response to a timing at which a potential of a second reference signal (Vr2) starts changing at the counting unit by a second amount per unit time which is greater than the first amount, to when a signal value of the comparison result signal obtained by comparing the first test signal with the second reference signal changes; and
   generating, a third digital signal having the count value generated by the counting unit as a result of counting the clock signal during a period from when the counting unit starts counting the clock signal in response to a timing at which a potential of at least one of the first reference signal and the second reference signal starts changing, to when a signal value of the comparison result signal obtained by comparing a signal of the analog signal based on the pixel signal with at least one of the first reference signal and the second reference signal changes, wherein the third digital signal is corrected on the basis of the first digital signal and the second digital signal, so as to reduce an offset which is included in the third digital signal, and arises from a difference between the timing at which the potential of at least one of the first reference signal (Vr1) and the second reference signal (Vr2) starts changing with time, and the timing at which the counting unit starts counting the clock signal.

2. The method according to claim 1, further comprising:
generating a fourth digital signal on the basis of the comparison result signal output by the comparison unit as a result of the comparison unit comparing a second test signal with the first reference signal, the second test signal having a signal value different from that of the first test signal; and
generating a fifth digital signal on the basis of the comparison result signal output by the comparison unit as a result of the comparison unit comparing the second test signal with the second reference signal, wherein
the third digital signal is corrected on the basis of a difference in signal value between the first digital signal and the fourth digital signal and a difference in signal value between the second digital signal and the fifth digital signal.

3. The method according to claim 2, wherein after the first digital signal and the second digital signal are generated, the fourth digital signal and the fifth digital signal are generated.

4. The method according to claim 2, wherein the third digital signal is corrected using correction values α and β which are derived using the following Equations $$\alpha = DS1 - G \times \beta \times DS2$$

$$\beta = \frac{DS1 - DN1}{G \times (DS2 - DN2)},$$

where DN1 denotes a signal value of the first digital signal, DN2 denotes a signal value of the second digital signal, DS1 denotes a signal value of the fourth digital signal, DS2 denotes a signal value of the fifth digital signal, and G denotes a ratio of the second amount per unit time to the first amount per unit time.

5. The method according to claim 4, wherein
the image pickup device includes
a plurality of the pixels arranged in a plurality of rows, and
a vertical scanning circuit configured to scan the plurality of pixels, and wherein
the first digital signal and the second digital signal are generated and the correction value α is derived during a period over which the vertical scanning circuit does not scan the plurality of pixels or a period over which a noise signal is being output to the comparison unit from the pixel.

6. The method according to claim 1, wherein the third digital signal is corrected using a correction value α which is derived using the following Equation α=DN1−G×DN2,
where DN1 denotes a signal value of the first digital signal, DN2 denotes a signal value of the second digital signal, and G denotes a ratio of the second amount per unit time to the first amount per unit time.

7. The method according to claim 1, further comprising after the first digital signal is generated using the analog-to-digital conversion unit, comparing, using the comparison unit, a potential of the signal based on the pixel signal with a potential of a threshold signal, and
setting, using the comparison unit, the first reference signal as the reference signal used for generating the third digital signal in a case where the potential of the threshold signal is higher than the potential of the signal based on the pixel signal, and
setting, using the comparison unit, the second reference signal as the reference signal used for generating the third digital signal in a case where the potential of the threshold signal is lower than the potential of the signal based on the pixel signal.

8. The method according to claim 1, wherein
the image pickup device includes
a plurality of the pixels arranged in a plurality of columns, and
a plurality of the analog-to-digital conversion units each provided for a corresponding one of the plurality of columns of the pixels, and
the method further comprises
deriving an average of differences, each of the differences being a difference between a signal value of the second digital signal and a signal value of the first digital signal obtained by a corresponding one of the plurality of analog-to-digital conversion units, and
correcting the third digital signals generated using the plurality of analog-to-digital conversion units on the basis of the derived average of differences.

9. The method according to claim 1, wherein
the image pickup device includes
a plurality of the pixels arranged in a plurality of columns, and
a plurality of the analog-to-digital conversion units each provided for a corresponding one of the plurality of columns of the pixels, and
the method further comprises correcting the third digital signals generated using the plurality of analog-to-digital conversion units on the basis of a difference between an average of the second digital signals generated using the plurality of analog-to-digital conversion units and an average of the first digital signals generated using the plurality of analog-to-digital conversion units.

10. The method according to claim 1, wherein
the image pickup device further includes an amplification unit, and
the signal based on the pixel signal is a signal output by the amplification unit as a result of the amplification unit amplifying the pixel signal.

11. The method according to claim 10, wherein
the pixel signal is supplied to an input node of the amplification unit, and
the first test signal is a signal output by the amplification unit on the basis of a reset potential at the input node of the amplification unit.

12. The method according to claim 1, wherein the first test signal is a signal based on a noise signal output by the pixel.

13. A method for driving an image capturing system, the image capturing system including:
an image pickup device including:
a pixel configured to output a pixel signal, and
an analog-to-digital conversion unit configured to convert an analog signal into a digital signal, the analog-to-digital conversion unit including:

a comparison unit configured to output a comparison result signal obtained by comparing an analog signal with a reference signal whose potential changes with time, a counting unit configured to count a clock signal, and a signal processing unit configured to process a signal output from the image pickup device, the method comprising:

generating a first digital signal having the count value generated by the counting unit as a result of counting the clock signal during a period from when the counting unit starts counting the clock signal in response to a timing at which a potential of a first reference signal (Vr1) starts changing at counting unit by a first amount per unit time, to when a signal value of the comparison result signal obtained by comparing a first test signal being the analog signal with the first reference signal changes;

generating a second digital signal having the count value generated by the counting unit as a result of counting the clock signal during a period from when the counting unit starts counting the clock signal in response to a timing at which a potential of a second reference signal (Vr2) starts changing at counting unit by a second amount per unit time which is greater than the first amount, to when a signal value of the comparison result signal obtained by comparing the first test signal with the second reference signal changes;

generating a third digital signal having the count value generated by the counting unit as a result of counting the clock signal during a period from when the counting unit starts counting the clock signal in response to a timing at which a potential of at least one of the first reference signal and the second reference signal starts changing, to when a signal value of the comparison result signal obtained by comparing a signal of the analog signal based on the pixel signal with at least one of the first reference signal and the second reference signal changes, wherein the third digital signal is counted on the basis of the first digital signal and the second digital signal, so as to reduce an offset which is included in the third digital, and arises from a difference between the timing at which the potential of at least one of the first reference signal (Vr1) and the second reference signal (Vr2) starts changing with time, and the timing at which the counting unit starts counting the clock signal.

14. The method according to claim 13, wherein the third digital signal is corrected, using the signal processing unit, on the basis of the first digital signal and the second digital signal.

15. An image pickup device comprising:

a pixel configured to output a pixel signal;

an analog-to-digital conversion unit configured to convert an analog signal into a digital signal, the analog-to-digital conversion unit including:

a comparison unit configured to output a comparison result signal obtained by comparing an analog signal with a reference signal, a counting unit configured to generate a count value by counting a clock signal, and a memory unit configured to hold:

a first digital signal having the count value generated by the counting unit as a result of counting the clock signal during a period from when the counting unit starts counting the clock signal in response to a timing at which a potential of a first reference signal (Vr1) starts changing at the counting unit by a first amount per unit time, to when a signal value of the comparison result signal obtained by comparing a first test signal being the analog signal with the first reference signal changes, a second digital signal having the count value generated by the counting unit as a result of counting the clock signal during a period from when the counting unit starts counting the clock signal in response to a timing at which a potential of a second reference signal (Vr2) starts changing at the counting unit by a second amount per unit time which is greater than the first amount, to when a signal value of the comparison result signal obtained by comparing the first test signal with the second reference signal changes, and a third digital signal having the count value generated by the counting unit as a result of counting the clock signal during a period from when the counting unit starts counting the clock signal in response to a timing at which a potential of at least one of the first reference signal and the second reference signal starts changing, to when a signal value of the comparison result signal obtained by comparing a signal of the analog signal based on the pixel signal with at least one of the first reference signal and the second reference signal changes;

a reference signal supply unit configured to supply a reference signal whose potential changes with time to the analog-to-digital conversion unit; and a correction unit configured to correct the third digital signal on the basis of the first digital signal and the second digital signal, so as to reduce an offset which is included in the third digital signal, and arises from a difference between the timing at which the potential of at least one of the first reference signal (Vr1) and the second reference signal (Vr2) starts changing with time, and the timing at which the counting unit starts counting the clock signal.

16. The image pickup device according to claim 15, further comprising a test signal supply unit configured to supply a test signal, and being electrically connected to the comparison unit, wherein the first test signal is a signal based on the test signal output to the comparison unit by the test signal supply unit.

17. The image pickup device according to claim 15, further comprising an amplification unit configured to amplify a pixel signal, the amplification unit being arranged in an electrical path between the pixel and the comparison unit, wherein the signal based on the pixel signal is a signal output by the amplification unit as a result of the amplification unit amplifying the pixel signal.

18. An image capturing system comprising:

the image pickup device according to claim 15; and a signal processing unit configured to process a signal output from the image pickup device.

19. An image capturing system comprising:

an image pickup device including:

a pixel configured to output a pixel signal, an analog-to-digital conversion unit configured to convert an analog signal into a digital signal, the analog-to-digital conversion unit comprising:

a comparison unit configured to output a comparison result signal obtained by comparing an analog signal with a reference signal, a counting unit configured to count a clock signal, and a memory unit configured to hold:

a first digital signal having the count value generated by the counting unit as a result of counting the clock signal during a period from when the counting unit starts counting the clock signal in response to a timing at which a potential of a first reference signal (Vr1) starts changing at the counting unit by a first amount per unit time, to when a signal value of the comparison result signal obtained by comparing a first test signal being the analog signal with the first reference signal changes, a second digital signal having the count value generated by the counting unit as a result of counting the clock signal during a period from when the counting unit starts counting the clock signal in response to a timing at which a potential of a second reference signal (Vr2) starts changing at the counting unit by a second amount per unit time which is greater than the first amount, to when a signal value of the comparison result signal obtained by comparing the first test signal with the second reference signal changes, and a third digital signal having the count value generated by the counting unit as a result of counting the clock signal during a period from when the counting unit starts counting the clock signal in response to a timing at which a potential of at least one of the first reference signal and the second reference signal starts changing, to when a signal value of the comparison result signal obtained by comparing a signal of the analog signal based on the pixel signal with at least one of the first reference signal and the second reference signal changes;

a reference signal supply unit configured to supply a reference signal whose potential changes with time to the analog-to-digital conversion unit;

a signal processing unit configured to process a signal output from the image pickup device; and a correction unit configured to correct the third digital signal on the basis of the first digital signal and the second digital signal, so as to reduce an offset which is included in the third digital signal, and arises from a difference between the timing at which the potential of at least one of the first reference signal (Vr1) and the second reference signal (Vr2) starts changing with time and the timing at which the counting unit starts counting the clock signal.

* * * * *